United States Patent
Kwon et al.

(10) Patent No.: US 8,952,517 B2
(45) Date of Patent: Feb. 10, 2015

(54) PACKAGE-ON-PACKAGE DEVICE AND METHOD OF FABRICATING THE SAME

(71) Applicant: Samsung Electronics Co., Ltd., Suwon-si, Gyeonggi-do (KR)

(72) Inventors: Heungkyu Kwon, Hwasung (KR); JeongOh Ha, Hwasung (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/831,367

(22) Filed: Mar. 14, 2013

(65) Prior Publication Data

US 2014/0001653 A1 Jan. 2, 2014

(30) Foreign Application Priority Data

Jun. 28, 2012 (KR) .................. 10-2012-0070154

(51) Int. Cl.
*H01L 23/02* (2006.01)
*H01L 23/48* (2006.01)
*H01L 23/52* (2006.01)
*H01L 29/40* (2006.01)
(Continued)

(52) U.S. Cl.
CPC .......... *H01L 25/0657* (2013.01); *H01L 25/105* (2013.01); *H01L 2224/16225* (2013.01); *H01L 2224/32225* (2013.01); *H01L 2224/48091* (2013.01); *H01L 2224/48227* (2013.01); *H01L 2224/73204* (2013.01); *H01L 2224/73265* (2013.01); *H01L 2924/15172* (2013.01); *H01L 2924/15192* (2013.01); *H01L 2924/15311* (2013.01); *H01L 2924/18161* (2013.01); *H01L 25/0655* (2013.01); *H01L 2224/26175* (2013.01); *H01L 2225/1023* (2013.01); *H01L 2225/1058* (2013.01); *H01L 2924/15331* (2013.01)

USPC .......... 257/686; 257/737; 257/738; 257/777; 257/E25.013

(58) Field of Classification Search
CPC ............... H01L 294/15311; H01L 294/15321; H01L 294/15331; H01L 25/0657
USPC ................. 257/686, 737, 738, 777, E25.013
See application file for complete search history.

(56) References Cited

U.S. PATENT DOCUMENTS

| | | | |
|---|---|---|---|
| 5,744,862 A * | 4/1998 | Ishii ............................. | 257/693 |
| 6,274,929 B1 * | 8/2001 | Leong et al. ................. | 257/724 |
| 6,278,616 B1 * | 8/2001 | Gelsomini et al. ........... | 361/803 |

(Continued)

FOREIGN PATENT DOCUMENTS

| | | |
|---|---|---|
| KR | 19970074651 | 12/1997 |
| KR | 20040056437 A | 7/2004 |

(Continued)

*Primary Examiner* — Mary Wilczewski
*Assistant Examiner* — Erik T Peterson
(74) *Attorney, Agent, or Firm* — Renaissance IP Law Group LLP

(57) ABSTRACT

Provided are a package-on-package device and a method of fabricating the same. In the device, solder balls may be disposed on two opposing side regions of a package substrate, such that the device can have a reduced size or width. In addition, input/output pads of the logic chip and the solder balls, which need to be directly connected to each other, can be disposed adjacent to each other. As a result, it is possible to improve routability of signals to and from the solder balls and to reduce the lengths of the interconnection lines. Accordingly, it is possible to reduce any signal interference, to increase signal delivery speed, and to improve signal-quality and power-delivery properties.

9 Claims, 21 Drawing Sheets

(51) Int. Cl.
*H01L 25/065* (2006.01)
*H01L 25/10* (2006.01)

(56) References Cited

U.S. PATENT DOCUMENTS

| | | | |
|---|---|---|---|
| 7,187,068 B2 | 3/2007 | Suh et al. | |
| 7,982,555 B2 | 7/2011 | Rofougaran | |
| 8,174,451 B2 | 5/2012 | Rofougaran | |
| 2002/0000327 A1* | 1/2002 | Juso et al. | 174/250 |
| 2004/0212069 A1 | 10/2004 | Chen et al. | |
| 2006/0033193 A1 | 2/2006 | Suh et al. | |
| 2007/0176284 A1 | 8/2007 | Choi | |
| 2008/0023812 A1* | 1/2008 | Bang et al. | 257/685 |
| 2008/0111224 A1 | 5/2008 | Byun et al. | |
| 2008/0138934 A1 | 6/2008 | Kim et al. | |
| 2008/0251913 A1* | 10/2008 | Inomata | 257/737 |
| 2009/0052218 A1* | 2/2009 | Kang | 365/51 |
| 2009/0057918 A1* | 3/2009 | Kim | 257/777 |
| 2009/0179318 A1* | 7/2009 | Chen | 257/686 |
| 2009/0243753 A1 | 10/2009 | Rofougaran | |
| 2010/0052132 A1* | 3/2010 | Baek et al. | 257/686 |
| 2010/0072593 A1* | 3/2010 | Kim et al. | 257/676 |
| 2010/0091537 A1* | 4/2010 | Best et al. | 365/51 |
| 2011/0037158 A1* | 2/2011 | Youn et al. | 257/686 |
| 2011/0063805 A1* | 3/2011 | Kim | 361/743 |
| 2011/0169708 A1 | 7/2011 | Rofougaran | |
| 2011/0176280 A1* | 7/2011 | Lee | 361/721 |
| 2011/0188210 A1* | 8/2011 | Huang et al. | 361/735 |
| 2011/0215451 A1* | 9/2011 | Yim et al. | 257/666 |
| 2011/0227209 A1 | 9/2011 | Yoon et al. | |
| 2012/0018871 A1* | 1/2012 | Lee et al. | 257/698 |
| 2013/0047046 A1* | 2/2013 | Goel | 714/727 |

FOREIGN PATENT DOCUMENTS

| | | |
|---|---|---|
| KR | 20040057640 A | 7/2004 |
| KR | 20060058376 A | 5/2006 |
| KR | 20100113676 A | 10/2010 |

* cited by examiner

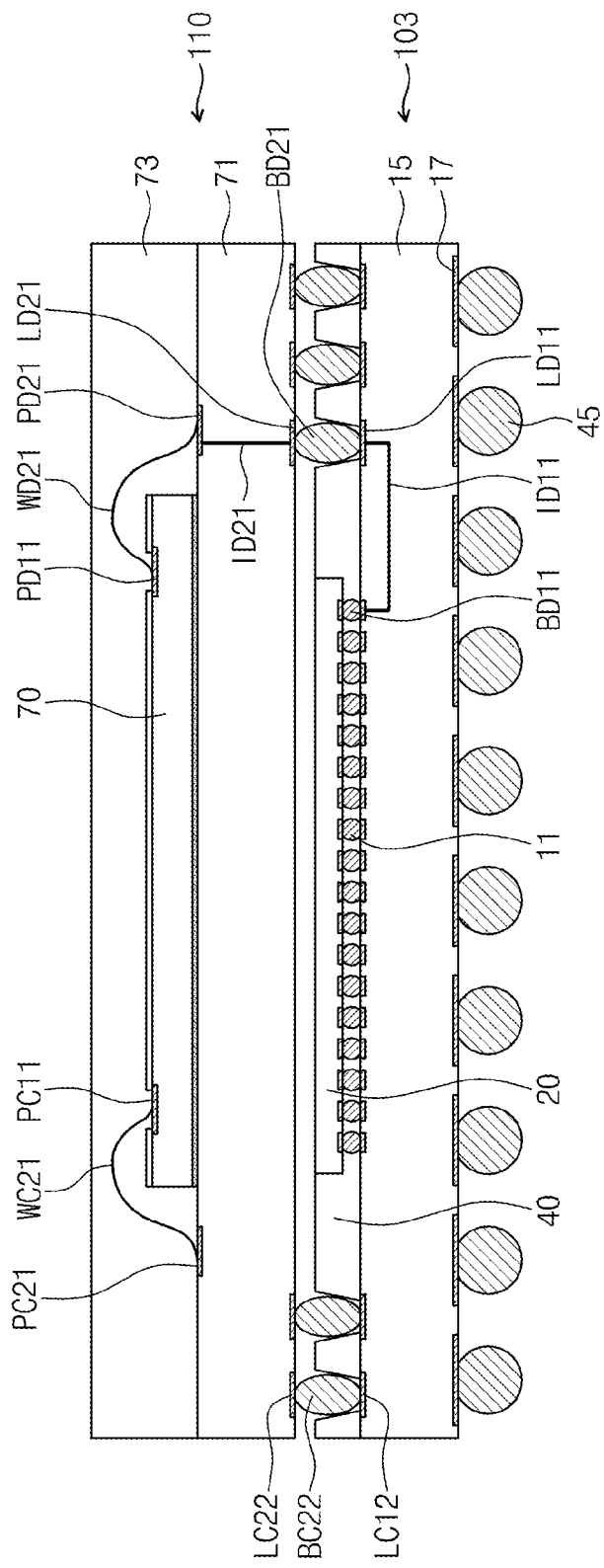

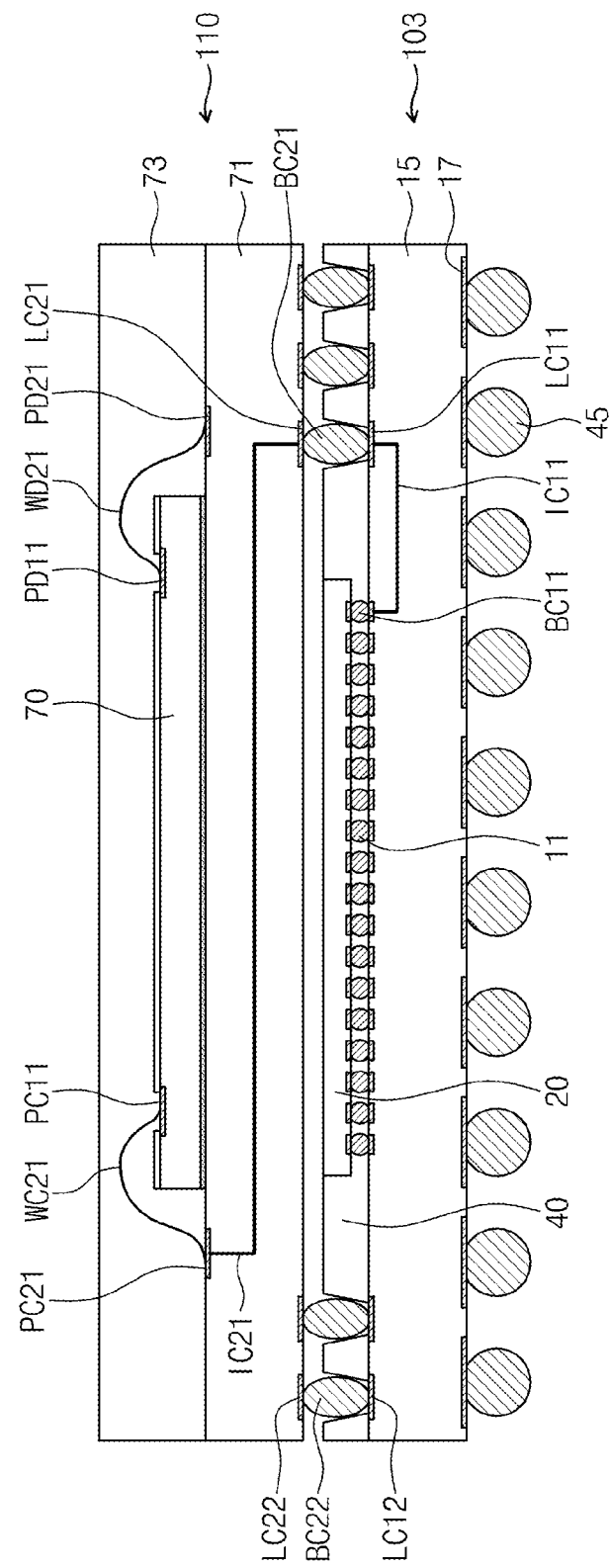

PACKAGE-ON-PACKAGE DEVICE AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2012-0070154, filed on Jun. 28, 2012, in the Korean Intellectual Property Office, the entire contents of which are hereby incorporated by reference.

BACKGROUND

Example embodiments of the inventive concept relate to a package-on-package device and a method of fabricating the same.

High-performance, high-speed and compact electronic systems are seeing increasing demand as the electronic industry matures. In response to such a demand, various semiconductor packaging techniques have been proposed. For example, methods have been suggested for stacking a plurality of semiconductor chips on a semiconductor substrate within a single package. Further, methods have been suggested for stacking a plurality of such packages to produce a so-called "package-on-package (PoP)" device. In particular, for the PoP device, a plurality of semiconductor chips or integrated circuits (ICs) may be provided in each package. Unfortunately and undesirably, this may increase the size, e.g. the width and/or length and/or thickness of the PoP device. Further, signal interconnection routing becomes more complex. Moreover, increased lengths of interconnection lines may result in technical difficulties, e.g. deterioration in a signal-quality and/or a power-delivery property of the device.

Thus, there is a need to meet the increasing demand for high-speed and compact electronic systems packaging without degrading overall device performance.

SUMMARY

Example embodiments of the inventive concept provide a more compact (e.g. narrower in at least one dimension) package-on-package device while also improving the signal-routing efficiency and thus the signal-conveying performance of the device's interconnection structure.

Other example embodiments of the inventive concept provide a method of fabricating a package-on-package (PoP) device, in which a mold layer can be formed without producing undesirable internal voids.

According to example embodiments of the inventive concepts, a package-on-package device may include a first semiconductor package including a first package substrate and a first logic chip mounted on the first package substrate; a second semiconductor package provided on the first semiconductor package to include a second package substrate and a memory chip mounted on the second package substrate; and a plurality of solder balls provided between the first and second package substrates to connect the first and second package substrates with each other. The first logic chip includes first, second, third, and fourth side surfaces disposed in that order around the logic chip's perimeter, and the solder balls may be provided on regions of the first package substrate adjacent to the first and third side surfaces opposing each other but not on regions of the first package substrate adjacent to the second and fourth side surfaces opposing each other.

In other words, solder balls are provided in regions on regions of the first package substrate adjacent to a first pair of opposing side surfaces but not on regions of the first package substrate adjacent a second pair of opposing side surfaces. This novel layout effectively shrinks the footprint of the overall device by narrowing its width, simplifies and shortens signal interconnection routing, and improves the device's performance. This shrinkage of the footprint of the overall device may be understood as a reduction in what is referred to herein as a "width" of the device corresponding with the vertical axes of, for example, FIGS. 1, 7, and 8 to be described in detail below, in accordance with various embodiments disclosed herein, by the omission of solder balls on the region of a first package substrate adjacent to two opposing side surfaces of the two pairs of opposing side surfaces of the logic chip mounted that is mounted on the first package substrate.

In example embodiments, the memory chip may include a first data input/output pad and a first command access input/output pad, the first logic chip may include a second data input/output pad and a second command access input/output pad forming counterparts to the first data input/output pad and the first command access input/output pad, respectively; the solder balls may include a first data ball electrically connecting the first and second data input/output pads with each other and a first command access ball electrically connecting the first and second command access input/output pads with each other; and the first data ball and the first command access ball may be disposed adjacent to the second data input/output pad and the second command access input/output pad, respectively.

In example embodiments, the first and second data input/output pads and the first data ball may be disposed adjacent to the third side surface, and the first and second command access input/output pads and the first command access ball may be disposed adjacent to the first side surface.

In example embodiments, the first logic chip may be mounted on the first package substrate in a flip-chip bonding manner, the first semiconductor package may further include an under-fill resin layer filling a space between the first logic chip and the first package substrate, and a mold layer spaced apart from the solder balls to cover the first logic chip.

In example embodiments, the first semiconductor package may further include a second logic chip mounted on the first package substrate and electrically connected to the first logic chip, and a dam disposed between the under-fill resin layer and the second logic chip. The mold layer extends to cover the dam and the second logic chip.

In example embodiments, the dam may extend between the first side surface and the solder ball and between the third side surface and the solder ball.

In example embodiments, the first and second data input/output pads, the second command access input/output pad, the first data ball and the first command access ball may be disposed adjacent to the third side surface, and the first command access pad may be disposed adjacent to the first side surface.

In example embodiments, the memory chip may further include a third data input/output pad and a third command access input/output pad applied with a power or ground voltage. The solder balls may include a second data ball electrically connected to the third data input/output pad but electrically separated from the second data input/output pad, and a second command access ball electrically connected to the third command access input/output pad but electrically separated from the second command access input/output pad. The second data ball may be disposed adjacent to the first data input/output pad, and the second command access ball may be disposed adjacent to the first command access input/output pad.

In example embodiments, the first logic chip may be mounted on the first package substrate in a flip-chip bonding manner, and the first semiconductor package may further include a mold layer covering a side surface of the first logic chip, exposing a top surface of the first logic chip, and filling a space between the first logic chip and the first package substrate.

In example embodiments, the mold layer may extend to have a portion interposed between solder balls that are disposed on the same substrate.

In example embodiments, the first semiconductor package may further include a second logic chip provided on the first package substrate and electrically connected to the first logic chip, and a wire electrically connecting the second logic chip with the first package substrate. The mold layer extends to cover the second logic chip and the wire.

In example embodiments, the first logic chip may further include an interface region provided with the second data input/output pad and the second command access input/output pad, and a central processing unit sending or receiving an electrical signal to or from the memory chip through the second data input/output pad and the second command access input/output pad to control the memory chip.

In example embodiments, the interface region may include a physical layer region.

In example embodiments, the memory chip may be a dynamic random access memory (DRAM) chip.

In example embodiments, the number of the solder balls adjacent to the first side surface may differ from that of the solder balls adjacent to the second side surface.

According to other example embodiments of the inventive concept, a method of fabricating a package-on-package device may include fabricating a first semiconductor package including a first package substrate and a first logic chip mounted thereon; fabricating a second semiconductor package including a second package substrate and a memory chip mounted thereon; and connecting the first package substrate with the second package substrate using solder balls. The solder balls are formed adjacent to a single pair of opposing side surfaces of the first logic chip.

In example embodiments, a package-on-package (PoP) electronic circuit device includes a first semiconductor package including a first package substrate and a first integrated circuit (IC) mounted on the first package substrate; a second semiconductor package provided on the first semiconductor package, the second semiconductor package including a second package substrate and a second IC mounted on the second package substrate; and a plurality of solder balls provided between the first and second package substrates to connect the first and second package substrates with each other, wherein the first IC includes a first and a second pair of opposing side surfaces, and wherein the solder balls are provided on regions of the first package substrate adjacent to the first pair of opposing side surfaces but not on regions of the first package substrate adjacent to the second pair of opposing side surfaces. The first integrated circuit typically may be a logic chip and the second integrated circuit typically may be a memory chip, and the detailed structure may be consistent with the example embodiments described above.

In example embodiments, the fabrication of the first semiconductor package may include mounting a first logic chip on the first package substrate in a flip-chip bonding manner, and forming a mold layer to expose a top surface of the first logic chip to cover a side surface of the first logic chip, and to fill a space between the first logic chip and the first package substrate.

In other example embodiments, the method for fabricating or manufacturing the device itself may include providing a first semiconductor package including a first package substrate and a first logic chip mounted on the first package substrate, the logic chip including first, second, third, and fourth side surfaces disposed in that order around the logic chip's perimeter; providing a second semiconductor package on the first semiconductor package, the second semiconductor package including a second package substrate and a memory chip mounted on the second package substrate; and providing a plurality of solder balls between the first and second package substrates to connect the first and second package substrates with each other in such manner that the solder balls are located on regions of the first package substrate adjacent to the first and third opposing side surfaces but not on regions of the first package substrate adjacent to the second and fourth opposing side surfaces of the logic chip.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 9A is a sectional view taken along a line E-E' of a package-on-package device including the semiconductor packages of FIGS. 8 and 2 stacked one over the other.

FIG. 9B is a sectional view taken along a line F-F' of a package-on-package device including the semiconductor packages of FIGS. 8 and 2 stacked one over the other.

Figure 1:
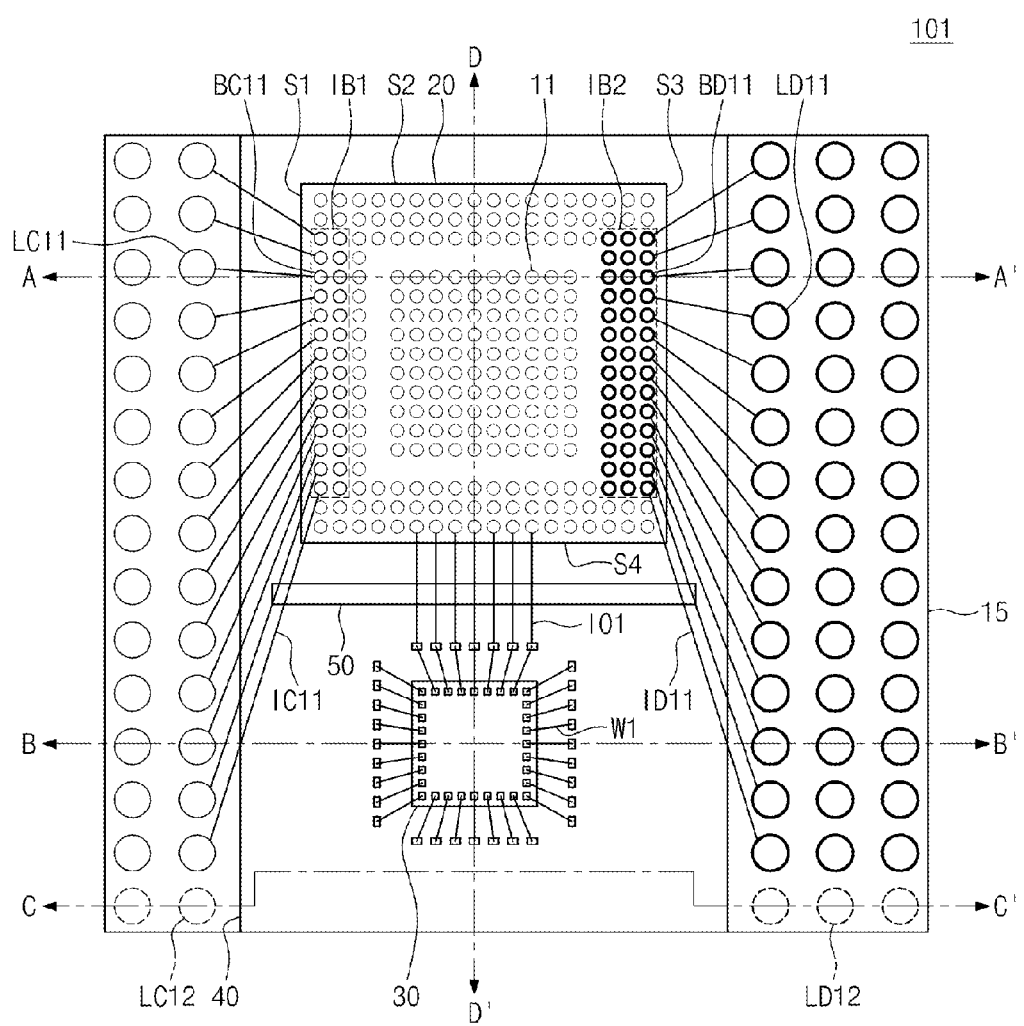
FIG. 1 is a plan view illustrating a first semiconductor package according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of similar or identical elements or features.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present except perhaps for a passive conductor, e.g. a land, a wire, or a solder ball, or the like. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
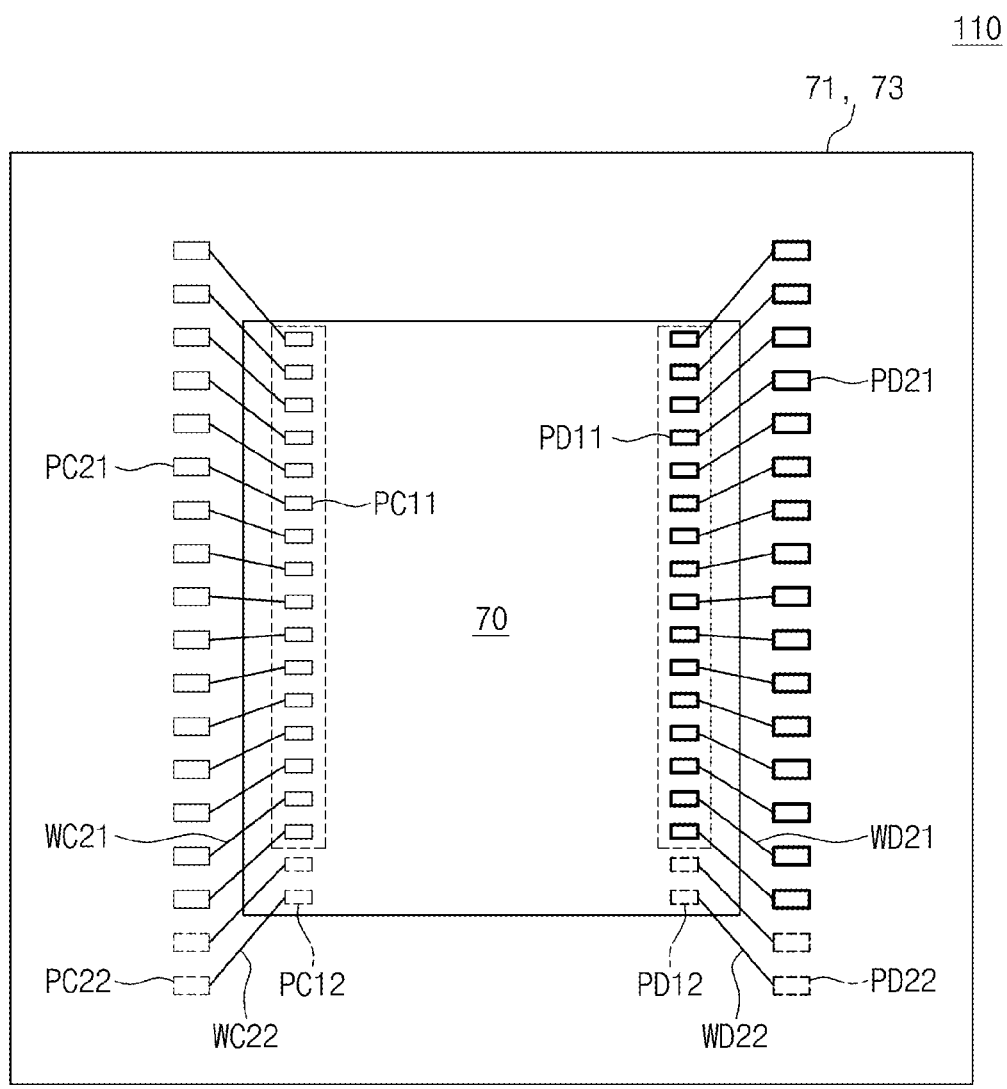
FIG. 2 is a plan view illustrating a second semiconductor package stacked on the first semiconductor package, according to example embodiments of the inventive concept.

FIG. 1 is a plan view illustrating a first semiconductor package according to example embodiments of the inventive concept. FIG. 2 is a plan view illustrating a second semiconductor package stacked on the first semiconductor package, according to example embodiments of the inventive concept. FIGS. 3A through 3D are sectional views taken along lines A-A', B-B', C-C', and D-D', respectively, of a package-on-package device including the semiconductor packages of FIGS. 1 and 2 stacked one over the other.

Referring to FIGS. 1, 2, and 3A through 3D, a package-on-package device may include a first semiconductor package 101 and a second semiconductor package 110 mounted thereon. The first semiconductor package 101 may include a first package substrate 15 and a first logic chip 20 and a second logic chip 30 mounted on the first package substrate 15. For example, the first logic chip 20 may be a digital baseband modem chip, and the second logic chip 30 may be an analog baseband modem chip.

The first logic chip 20 may be mounted on the first package substrate 15 in a flip-chip bonding manner using bumps. The bumps may include a data bump BD11, a command/access bump BC11, and other bumps 11. An under-fill resin layer 25 may be provided to fill a space between the first logic chip 20 and the first package substrate 15. In example embodiments, the under-fill resin layer 25 (see FIG. 3A or FIG. 3D) may be provided to cover a bottom and side surface of the first logic chip 20. The first logic chip 20 may include first to fourth side surfaces S1, S2, S3, and S4, which may be sequentially disposed in a clockwise direction and may be connected to each other. The second logic chip 30 may be mounted on the first package substrate 15, in a wire bonding manner, by one or more wires such as a first wire W1.

Upper ball lands may be provided on a top surface of the first package substrate 15 and adjacent to the first and third side surfaces S1 and S3, and first lower ball lands 17 may be provided on a bottom surface of the first package substrate 15. The upper ball lands may include an eleventh command/access ball land LC11, a twelfth command/access ball land LC12, an eleventh data ball land LD11, and a twelfth data ball land LD12. External solder balls 45 may be attached on the lower ball lands 17. The first logic chip 20 and the second logic chip 30 may be covered with a first mold layer 40. The first mold layer 40 may be provided spaced apart from the upper ball lands LC11, LC12, LD11, and LD12. The first mold layer 40 may be formed to have a top surface higher than a top of the first wire W1.

A dam 50 may be provided on the first package substrate 15 and between the first logic chip 20 and the second logic chip 30. During the formation of the under-fill resin layer 25, the dam 50 may prevent an under-fill resin solution for the under-fill resin layer 25 from being flowed into the second logic chip 30.

First internal wirings may be provided in the first package substrate 15. In example embodiments, the first internal wirings may include a logic chip connection internal wiring IO1, an eleventh command/access internal wiring IC11, a twelfth command/access internal wiring IC12, an eleventh data internal wiring ID11, and a twelfth data internal wiring ID12.

The second logic chip 30 may transmit an analog signal received from the outside to the first logic chip 20 via the logic chip connection internal wiring IO1, and the first logic chip 20 may convert the analog signal received from the second logic chip 30 into a digital signal and transmit it to a memory chip 70. In addition, the first logic chip 20 may convert a digital signal received from the memory chip 70 into an analog signal and transmit it to the second logic chip 30 via the logic chip connection internal wiring IO1. In example embodiments, the second logic chip 30 may not be directly connected to the memory chip 70 and may instead be directly connected to only the first logic chip 20.

The second semiconductor package 110 may include a second package substrate 71 and the memory chip 70 mounted thereon. In example embodiments, the memory chip 70 may be a dynamic random access memory (DRAM) chip. The memory chip 70 may include first bonding pads. In example embodiments, the first bonding pads may include an eleventh command/access pad PC11, a twelfth command/access pad PC12, an eleventh data pad PD11, and a twelfth data pad PD12. The memory chip 70 and the second package substrate 71 may be covered with a second mold layer 73.

Conductive pads may be provided on a top surface of the second package substrate 71, and second lower ball lands may be provided on a bottom surface of the second package substrate 71. In example embodiments, the conductive pads may include a twenty-first command/access pad PC21, a twenty-second command/access pad PC22, a twenty-first data pad PD21, and a twenty-second data pad pattern PD22. The second lower ball lands may include a twenty-first command/access ball land LC21, a twenty-second command/access ball land LC22, a twenty-first data ball land LD21, and a twenty-second data ball land LD22. The memory chip 70 may be mounted on the second package substrate 71 in a wire bonding manner using second wires. In example embodiments, the second wires may include a twenty-first command/access wire WC21, a twenty-second command/access wire WC22, a twenty-first data wire WD21, and a twenty-second data wire WD22.

Second internal wirings may be provided in the second package substrate 71. In example embodiments, the second internal wirings may include a twenty-first command/access internal wiring IC21, a twenty-second command/access internal wiring IC22, a twenty-first data internal wiring ID21, and a twenty-second data internal wiring ID22.

The first package substrate 15 and the second package substrate 71 may be electrically connected to each other by internal solder balls interposed therebetween. The internal solder balls may include a twenty-first command/access ball BC21, a twenty-second command/access ball BC22, a twenty-first data ball BD21, and a twenty-second data ball BD22. In example embodiments, the first mold layer 40 may have a top surface higher than that of the dam 50, and in this case, the first mold layer 40 may have a relatively large thickness. This may lead to an increase in a space between the first package substrate 15 and the second package substrate 71 and in sizes of the internal solder balls BC21, BC22, BD21, and BD22. The internal solder balls BC21, BC22, BD21, and BD22 may be arranged with an increased space in order to prevent a problem of electrical short caused by the increase in sizes of the internal solder balls BC21, BC22, BD21, and BD22. In example embodiments, the internal solder balls BC21, BC22, BD21, and BD22 may be formed to have spaces greater than, for example, 0.65 millimeters (mm).

In the present embodiment, a command signal or an access signal may be input or output through the eleventh command/access pads PC11, and a power or ground voltage for the command and access signals may be applied to the twelfth command/access pads PC12. Here, the eleventh and twelfth command/access pads PC11 and PC12 may be provided adjacent to one side surface of the memory chip 70 (for example, adjacent to the first side surface S1 of the first logic chip 20). A data signal may be input or output through the eleventh data pads PD11, and a power or ground voltage for the data signal may be applied to the twelfth data pads PD12. Here, the eleventh and twelfth data pads PD11 and PD12 may be provided adjacent to other side surface of the memory chip 70 (for example, adjacent to the third side surface S3 of the first logic chip 20).

Figure 3A:
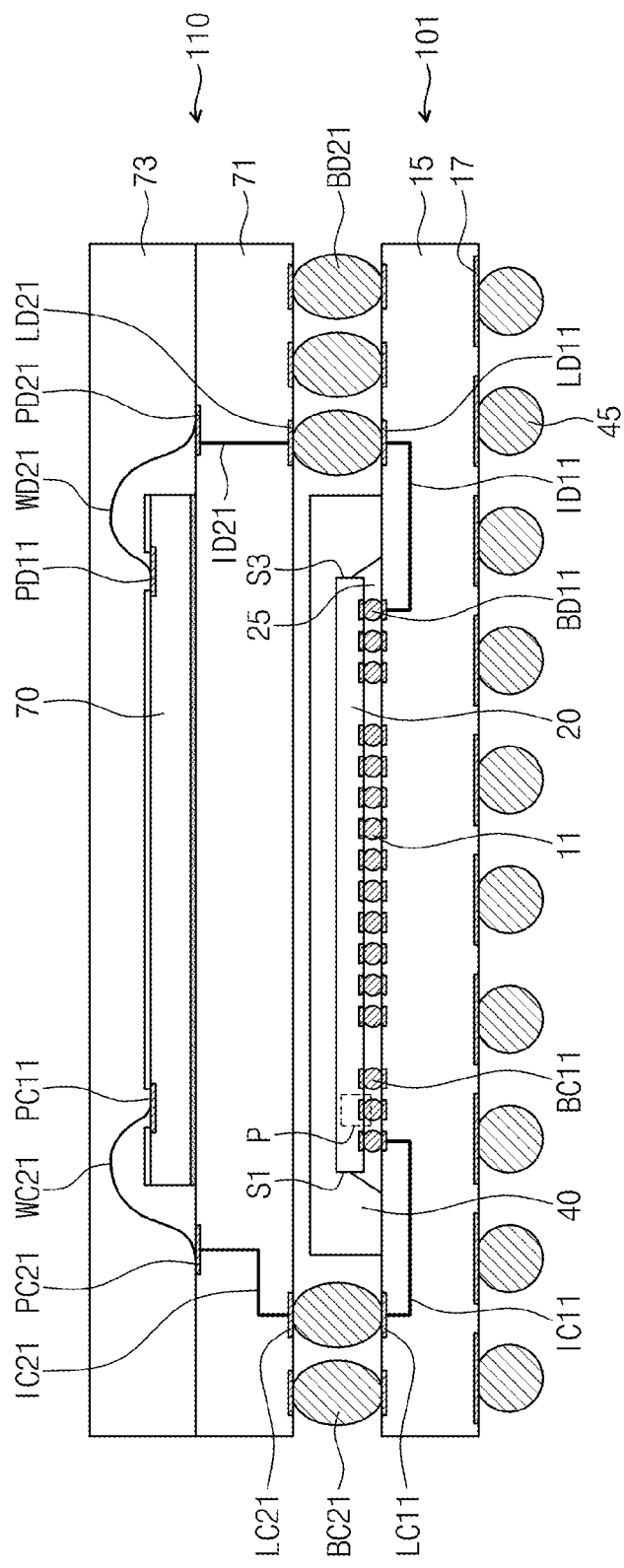
FIG. 3A is a sectional view taken along a line A-A' of a package-on-package device including the semiconductor packages of FIGS. 1 and 2 stacked one over the other.
Figure 3B:
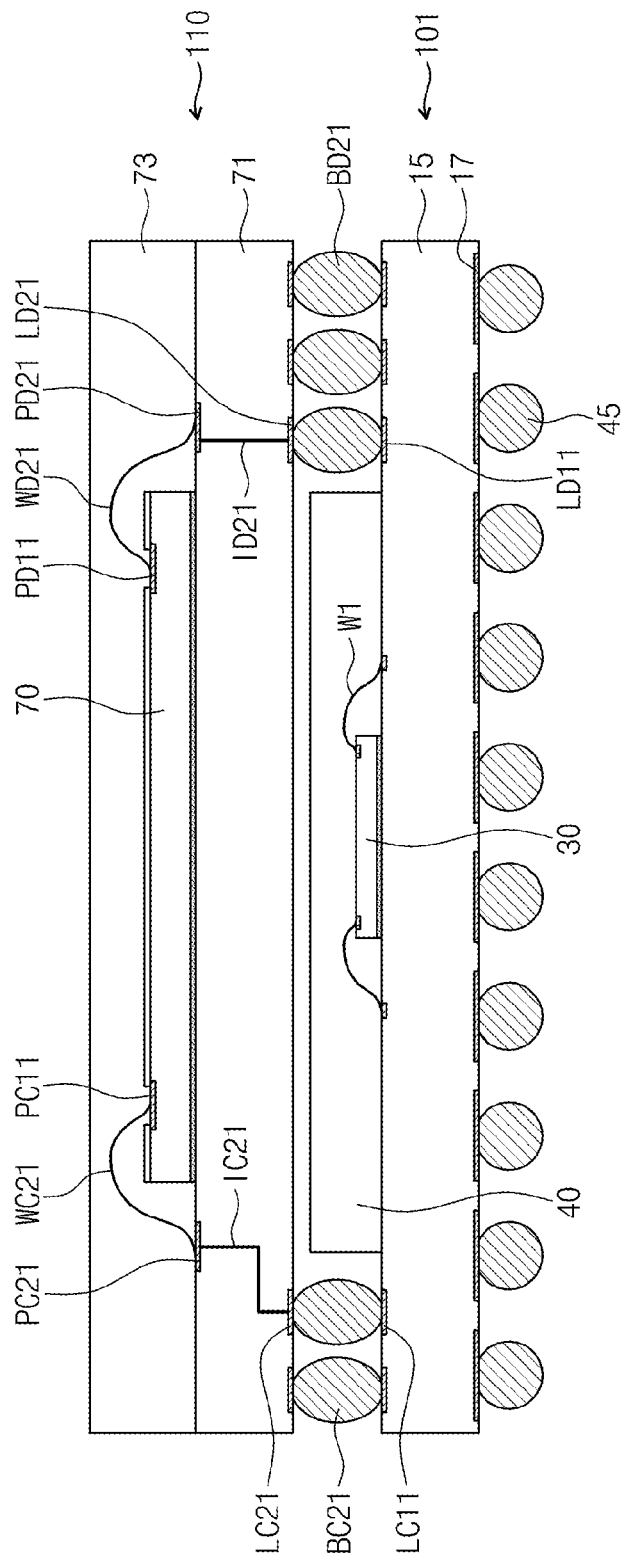
FIG. 3B is a sectional view taken along a line B-B' of a package-on-package device including the semiconductor packages of FIGS. 1 and 2 stacked one over the other.
Figure 3C:
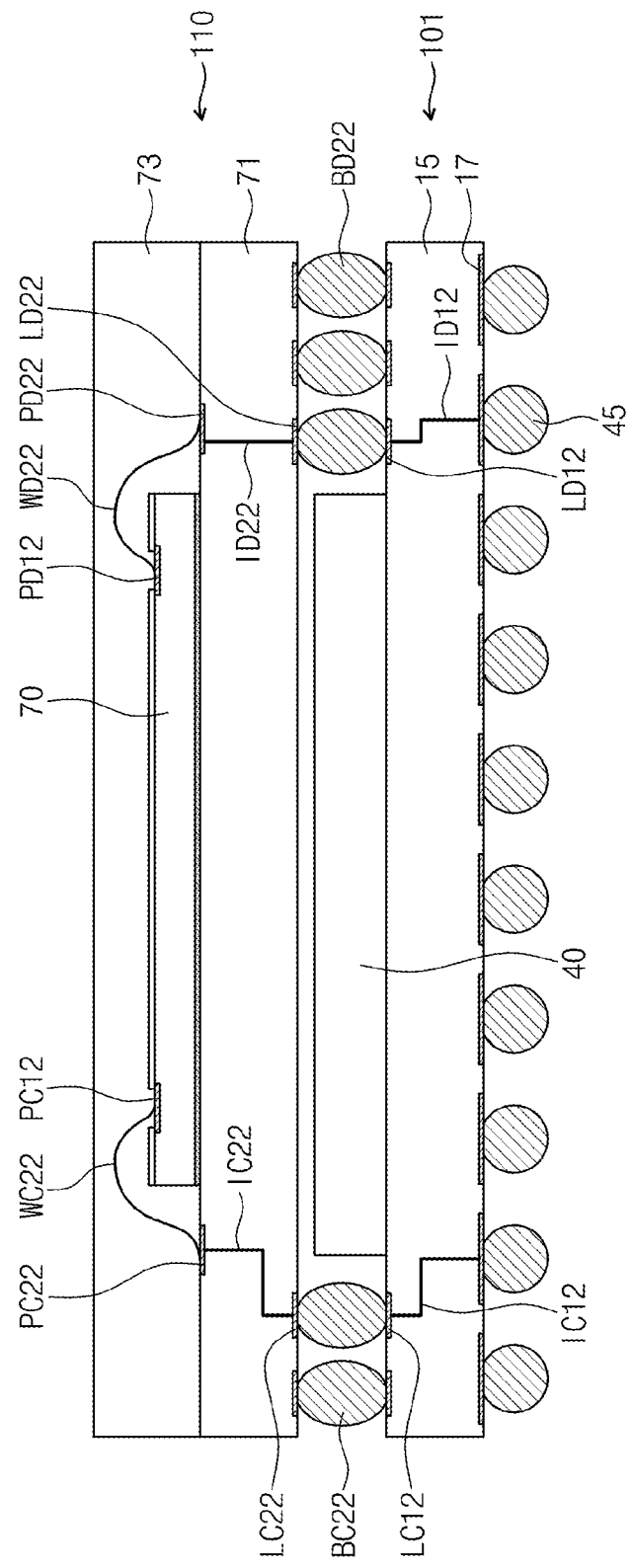
FIG. 3C is a sectional view taken along a line C-C' of a package-on-package device including the semiconductor packages of FIGS. 1 and 2 stacked one over the other.
Figure 3D:
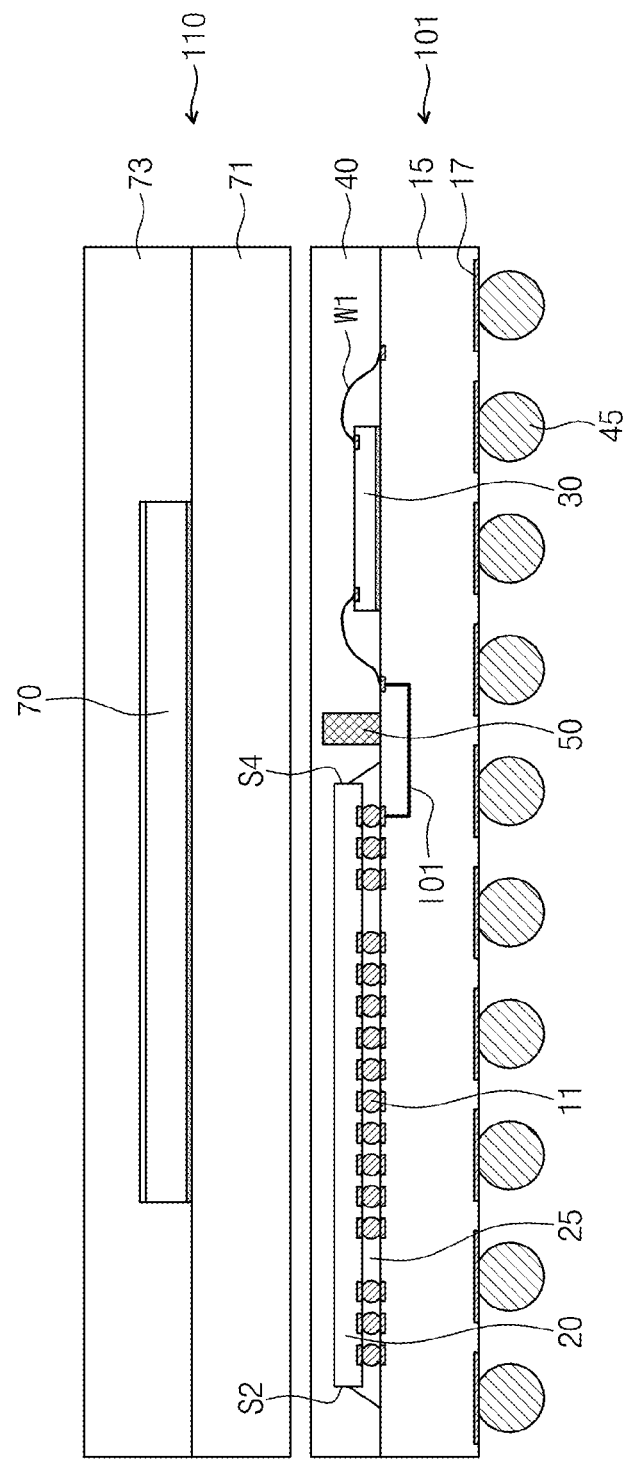
FIG. 3D is a sectional view taken along a line D-D' of a package-on-package device including the semiconductor packages of FIGS. 1 and 2 stacked one over the other.
Figure 4:
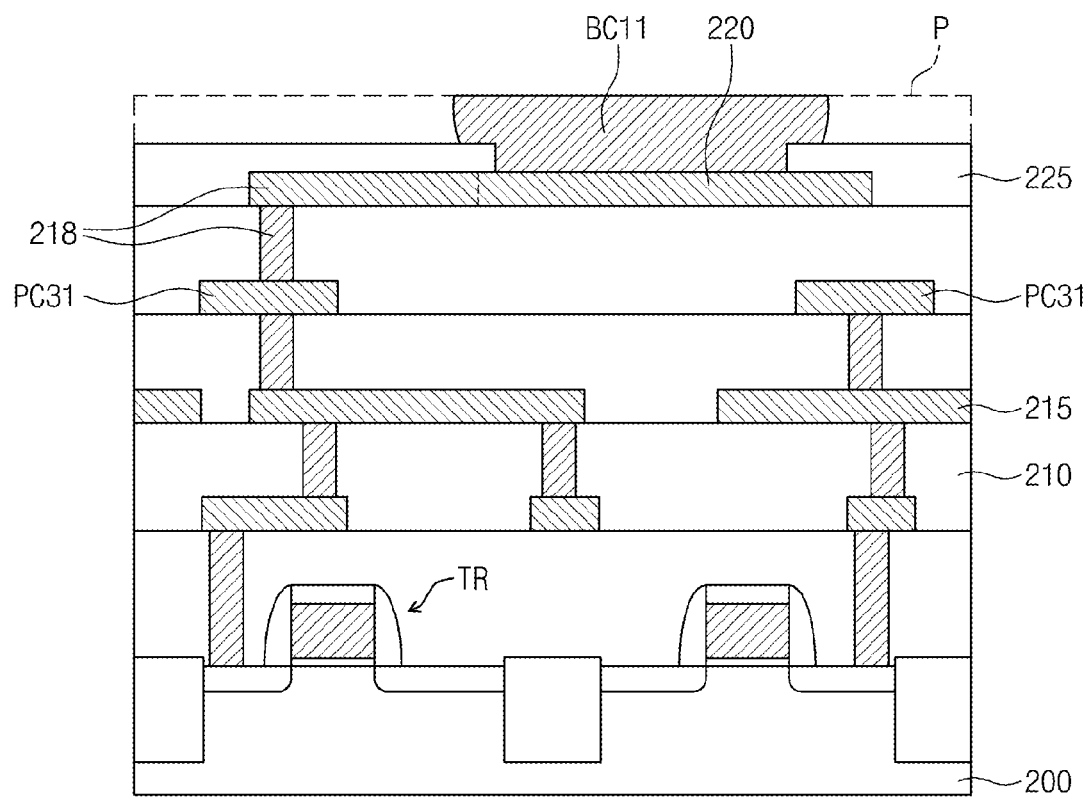
FIG. 4 is an enlarged sectional view of a portion 'P' of FIG. 3A.
Figure 5:
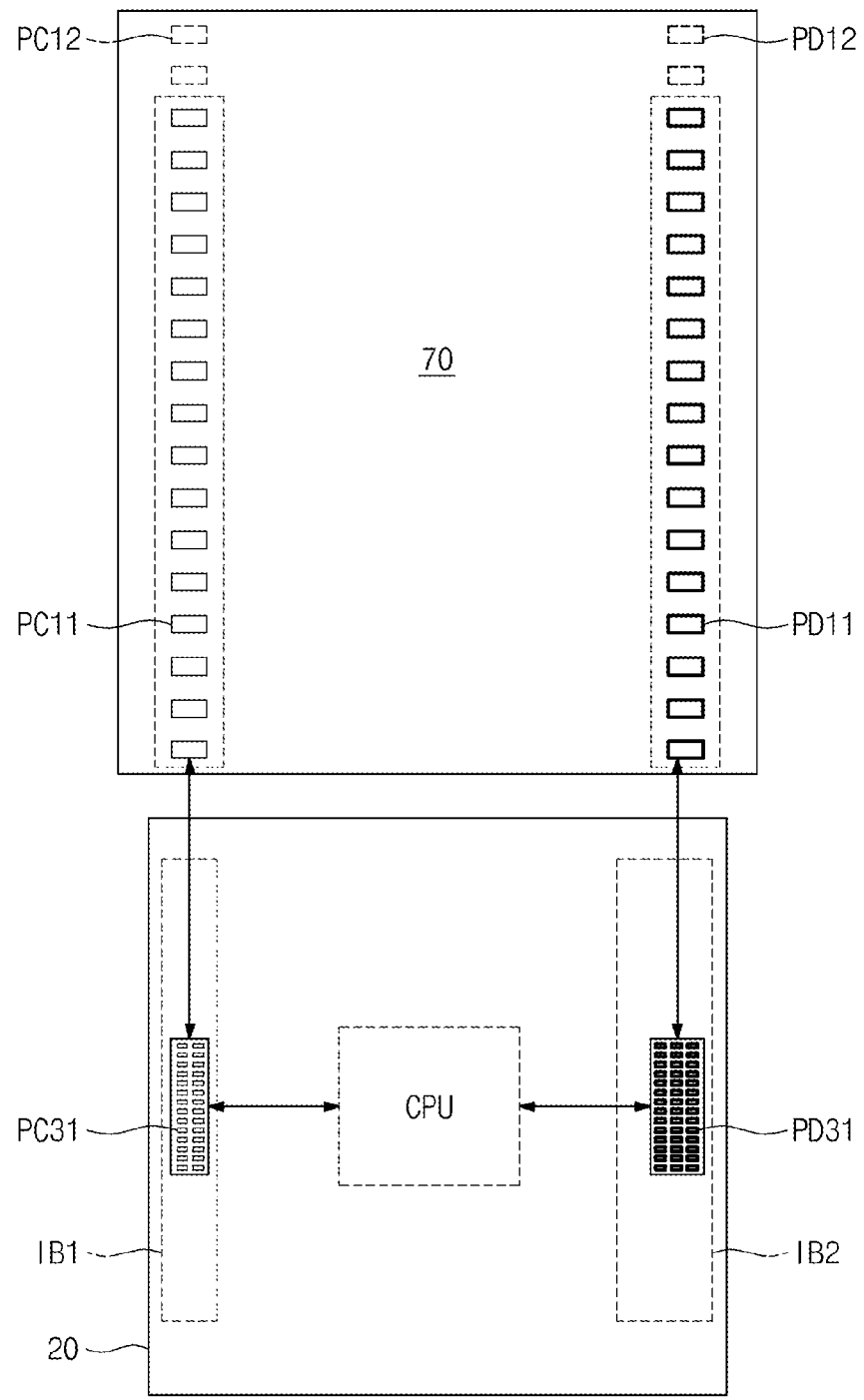
FIG. 5 is a plan view schematically illustrating a connection relation between the first and second semiconductor packages shown in FIGS. 1 and 2, respectively.

FIG. 4 is an enlarged and inverted sectional view of a portion P of FIG. 3A, and FIG. 5 is a plan view schematically illustrating a connection relation between the first and second semiconductor packages shown in FIGS. 1 and 2, respectively.

Referring to FIGS. 1, 2, 3A through 3D, 4, and 5, the first logic chip 20 may include a semiconductor substrate 200, a plurality of transistors TR provided on the semiconductor substrate 200, conductors or so-called 'wirings' 215 electrically connected to the transistors TR, and interlayer insulating layers 210 covering the transistors TR and the wirings 215. The wirings 215 may include thirty-first command/access pads PC31 and thirty-first data pads PD31, for example, located at the uppermost level. The thirty-first command/access pads PC31 and the thirty-first data pads PD31 may be connected to second bonding pads 220 through re-distributed lines 218, respectively. The re-distributed lines 218 and a portion of the second bonding pads 220 may be covered with a passivation layer 225. The bumps BD11, BC11, and 11 may be provided on the second bonding pads 220, respectively. The thirty-first command/access pads PC31 and the thirty-first data pads PD31 may have widths and spaces smaller than those of the bumps BD11, BC11, and 11. The command or access signal may be input or output from/to the first logic chip 20 through the command/access bumps BC11 disposed within a first interface region IB1, and the data signal may be input or output through the data bumps BD11 disposed within a second interface region IB2. The first interface region IB1 may be located adjacent to the first side surface S1 of the first logic chip 20, and the second interface region IB2 may be located adjacent to the third side surface S3 opposite the first side surface S1. The first logic chip 20 may include or serve as a central processing unit (CPU). Each of the interface regions IB1 and IB2 may be an interface region between the CPU of the first logic chip 20 and the memory chip 70 may include input/output pads for transmitting signals. The interface regions IB1 and IB2 may include a physical layer region. The physical layer region may be configured to alter a data signal from the thirty-first command/access pads PC31 and the thirty-first data pads PD31 to a form suitable for processing by the CPU. In addition, the physical layer region may enable the package-on-package device to have a higher operational speed. All or each of the CPU, the interface regions IB1 and IB2, and the physical layer region may be a portion of a circuit region constituted by the transistors TR and the wirings 215. Although not shown, a controller may be further provided between the CPU and the interface regions IB1 and IB2. The controller may be configured to control the input/output pads.

The thirty-first command/access pads PC31 and the thirty-first data pads PD31 may serve as input/output pads for command/access/data signals of the interface regions IB1 and IB2 or as input/output pads for command/access/data signals of the physical layer region.

The number of the data balls BD21 and BD22 may be different from that of the command/access balls BC21 and BC22. For example, the number of the data balls BD21 and BD22 may be greater than that of the command/access balls BC21 and BC22, when the number of the data signals is greater than that of the command/access signals.

Referring to FIGS. 1, 3A, 4 and 5, the eleventh command/access pad PC11 of the memory chip 70, through which the command/access signal is input or output, may be electrically connected to the thirty-first command/access pad PC31 of the first logic chip 30, through the twenty-first command/access wire WC21, the twenty-first command/access pad PC21, the twenty-first command/access internal wiring IC21, the twenty-first command/access ball land LC21, the twenty-first command/access ball BC21, the eleventh command/access ball land LC11, the eleventh command/access internal wiring IC11, and the eleventh command/access bump BC11. All of them may be disposed adjacent to the first side surface S1, and thus, a path length for signal transmission can be reduced, thereby to suppress any signal interference and to improve the performance of the device.

Referring to FIGS. 1, 3A, 4 and 5, the eleventh data pad PD11 of the memory chip 70, through which the data signal is input or output, may be electrically connected to the thirty-first data pad PD31 of the first logic chip 30, through the twenty-first data wire WD21, the twenty-first data pad PD21, the twenty-first data internal wiring ID21, the twenty-first data ball land LD21, the twenty-first data ball BD21, the eleventh data ball land LD11, the eleventh data internal wiring ID11, and the eleventh data bump BD11. All of them may be disposed adjacent to the third side surface S3, and thus, a path length for signal transmission can be reduced, allowing to suppress any signal interference and to improve the performance of the device.

Referring to FIGS. 1, 3C, 4 and 5, the twelfth command/access pad PC12 of the memory chip 70, to which the power or ground voltage for the command/access signal is applied, may be connected to the external solder ball 45 through the twenty-second command/access wire WC22, the twenty-second command/access pad PC22, the twenty-second command/access internal wiring IC22, the twenty-second command/access ball land LC22, the twenty-second command/access ball BC22, the twelfth command/access ball land LC12, the twelfth command/access internal wiring IC12, and the first lower ball land 17. All of them may be disposed adjacent to the first side surface S1, and thus, a path length for signal transmission can be reduced, thereby to suppress any signal interference and to improve the performance of the device.

Referring to FIGS. 1, 3C, 4 and 5, the twelfth data pad PD12 of the memory chip 70, to which the power or ground voltage for the data signal is applied, may be connected to the external solder ball 45 through the twenty-second data wire WD22, the twenty-second data pad PD22, the twenty-second data internal wiring ID22, the twenty-second data ball land LD22, the twenty-second data ball BD22, the twelfth data ball land LD12, the twelfth data internal wiring ID12, and the first lower ball land 17. All of them may be disposed adjacent to the third side surface S3, and thus, a path length for signal transmission can be reduced, thereby to suppress any signal interference and to improve the performance of the device.

The other bumps 11 may be configured to connect the central processing unit CPU with the external solder ball 45 directly.

In the package-on-package device according to example embodiments of the inventive concept, the internal solder balls BC21, BC22, BD21, and BD22 may be disposed not to surround all sides of the first logic chip 20 but may be disposed instead adjacent only to the first and third side surfaces S1 and S3 of the first logic chip 20. This enables a width of the device to be reduced.

In addition, the input/output pads of the logic chip and the solder balls, which may be configured to transmit the same signal and need to be directly connected to each other, are disposed to be adjacent to each other. Accordingly, it is possible to improve routability of signals to and from the solder balls thus to reduce a path length of the interconnection structure. As a result, it is possible to suppress any signal interference from occurring and to improve signal delivery speed, signal quality, and power delivery properties that enable higher device performance.

Figure 6:
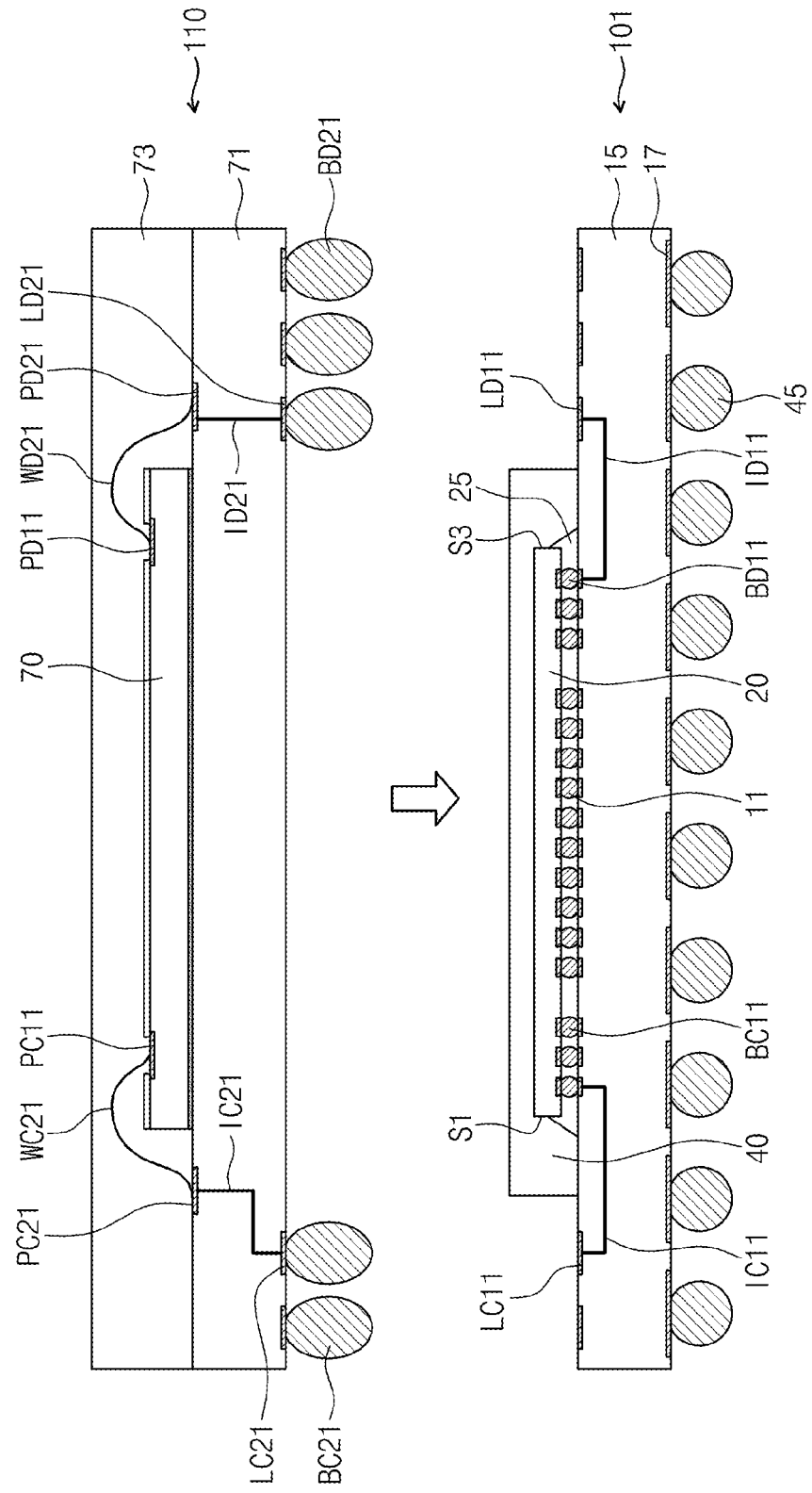
FIG. 6 is a sectional view illustrating a process of fabricating the package-on-package device of FIG. 3A.

FIG. 6 is a sectional view illustrating a process of fabricating the package-on-package device of FIG. 3A.

Referring to FIGS. 1, 2, 3A through 3D, and 6, the first logic chip 20 may be mounted on the first package substrate 15 in a flip-chip bonding manner. The second logic chip 30 may be mounted on the first package substrate 15 in a wire bonding manner. The dam 50 may be formed on the first package substrate 15 to be disposed between the first logic chip 20 and the second logic chip 30 (for example, adjacent to the fourth side surface S4 of the first logic chip 20). An under-fill resin solution may be supplied from a position adjacent to the second side surface S2 of the first logic chip 20 and may be flowed into a gap region between the first logic chip 20 and the first package substrate 15 by capillary phenomena. Next, the under-fill resin solution may be cured to form the under-fill resin layer 25. The first mold layer 40 may be formed to cover the first logic chip 20 and the second logic chip 30. Here, the first mold layer 40 may be formed to be spaced apart from the upper ball lands LC11, LC12, LD11, and LD12 and may have a top surface higher than the top surface of the dam 50 and the top of the first wire W1. The external solder balls 45 may be attached to the bottom surface of the first package substrate 15. As a result, the first semiconductor package 101 may be formed.

The memory chip 70 may be mounted on the second package substrate 71 in a wire bonding manner, and the second mold layer 73 may be formed on the resulting structure. The second mold layer 73 may be formed to have a top surface higher than the tops of the second wires WC21, WC22, WD21, and WD22. The internal solder balls BC21, BC22, BD21, and BD22 may be attached to the bottom surface of the second package substrate 71. As a result, the second semiconductor package 110 may be formed.

The second semiconductor package 110 may be positioned on the first semiconductor package 101 and then may be thermally treated in such a way that the internal solder balls BC21, BC22, BD21, and BD22 may be melted and attached to the upper ball lands LC11, LC12, LD11, and LD12, respectively. As a result, a package-on-package device according to example embodiments of the inventive concept may be formed.

Figure 7:
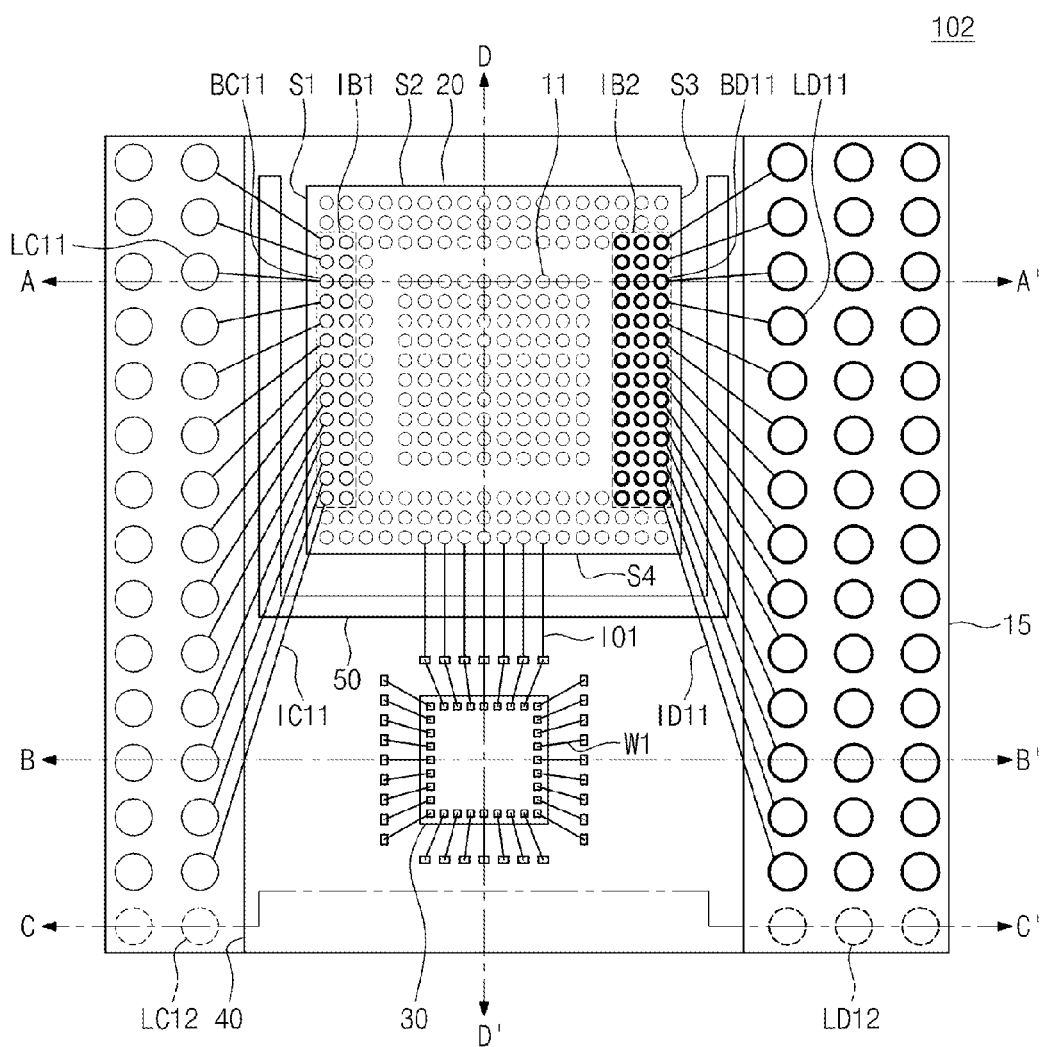
FIG. 7 is a plan view illustrating a first semiconductor package according to other example embodiments of the inventive concept.

FIG. 7 is a plan view illustrating a first semiconductor package according to other example embodiments of the inventive concept.

According to other example embodiments of the inventive concept, as shown in FIG. 7, a first semiconductor package 102 may include the dam 50, which may be provided between the first logic chip 20 and the second logic chip 30 and further include portions extending along the first side surface S1 and the third side surface S3. The extending portions of the dam 50 may be spaced apart from the first side surface S1 and the third side surface S3. Except for this, the first semiconductor package 102 may be configured to have the same technical features as that of the embodiment previously described with reference to FIG. 1.

Although not shown, the dam 50 may further extend along the second side surface S2, thereby forming a closed-loop dam substantially entirely surrounding the first logic chip 20.

Figure 8:
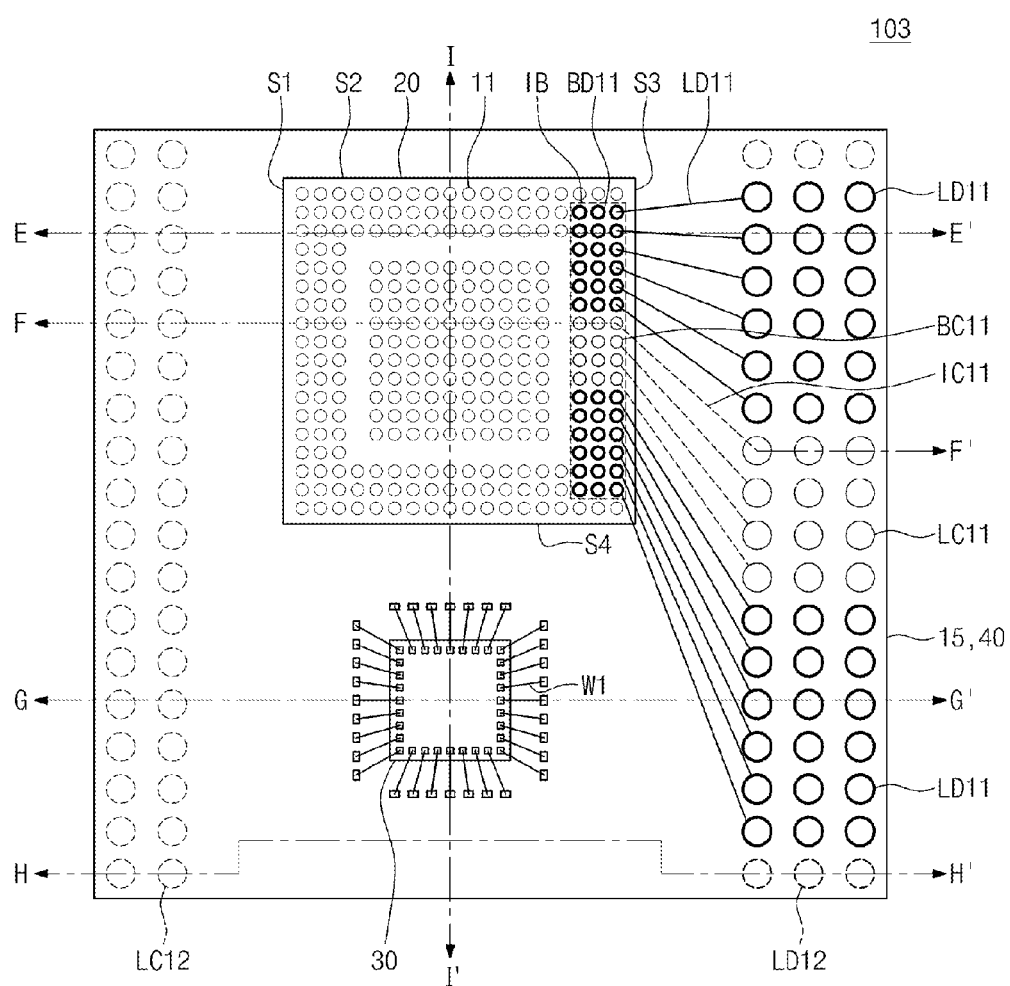
FIG. 8 is a plan view illustrating a first semiconductor package according to still other example embodiments of the inventive concept.

FIG. 8 is a plan view illustrating a first semiconductor package according to still other example embodiments of the inventive concept. FIGS. 9A through 9E are sectional views taken along lines E-E', F-F', G-G', H-H', and I-I', respectively, of a package-on-package device including the semiconductor packages of FIGS. 8 and 2 stacked one over the other. FIG. 10 is a plan view schematically illustrating a connection relation between the first and second semiconductor packages shown in FIGS. 8 and 2, respectively.

Figure 9C:
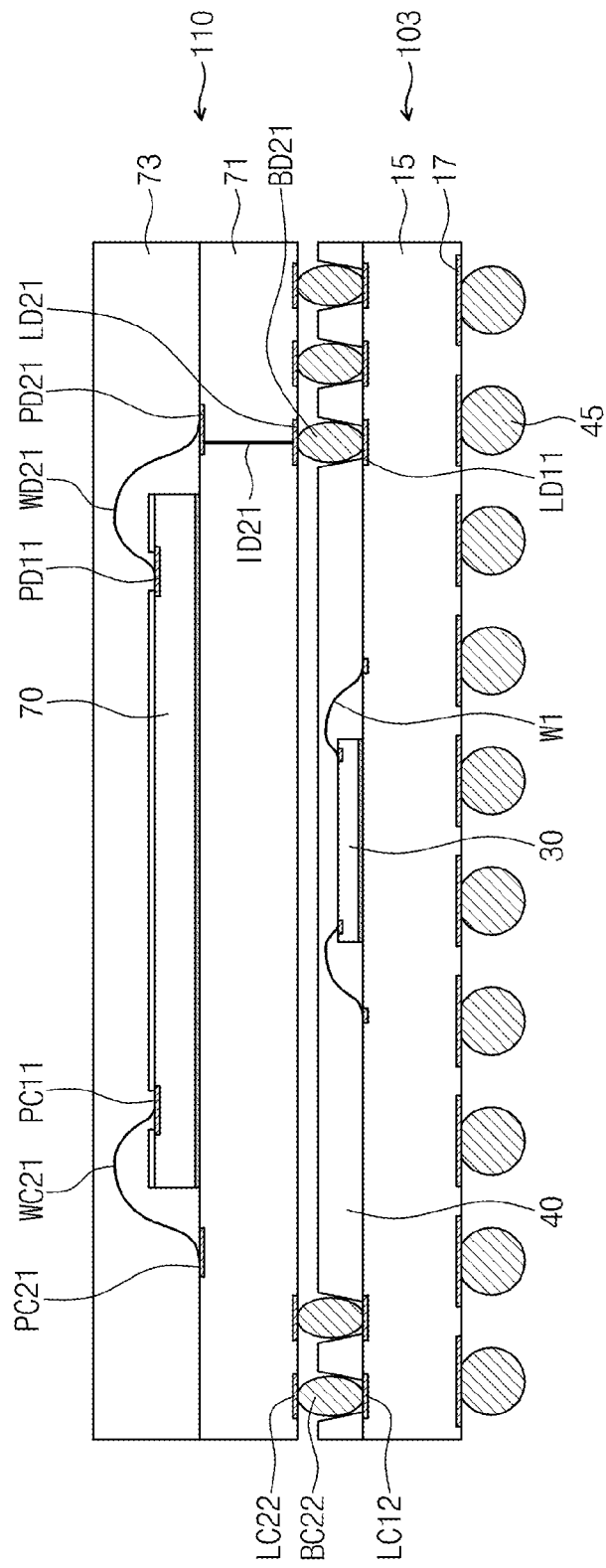
FIG. 9C is a sectional view taken along a line G-G' of a package-on-package device including the semiconductor packages of FIGS. 8 and 2 stacked one over the other.
Figure 9D:
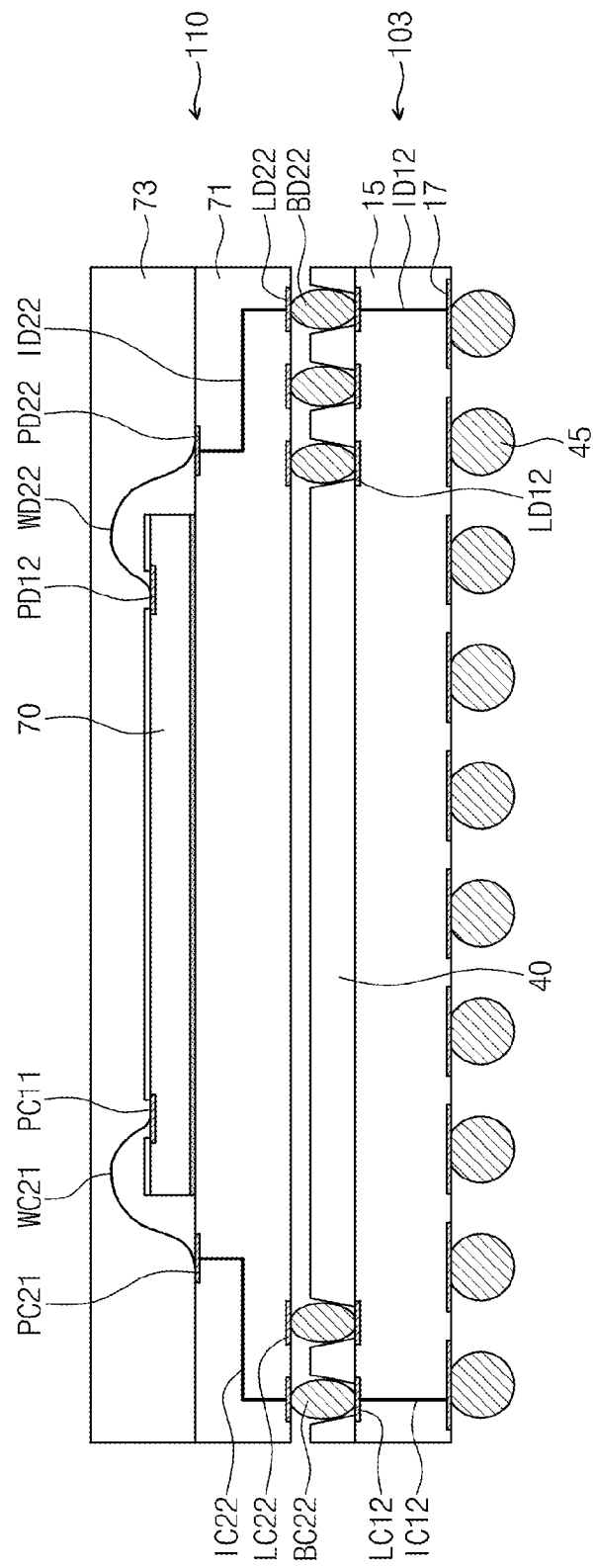
FIG. 9D is a sectional view taken along a line H-H' of a package-on-package device including the semiconductor packages of FIGS. 8 and 2 stacked one over the other.
Figure 9E:
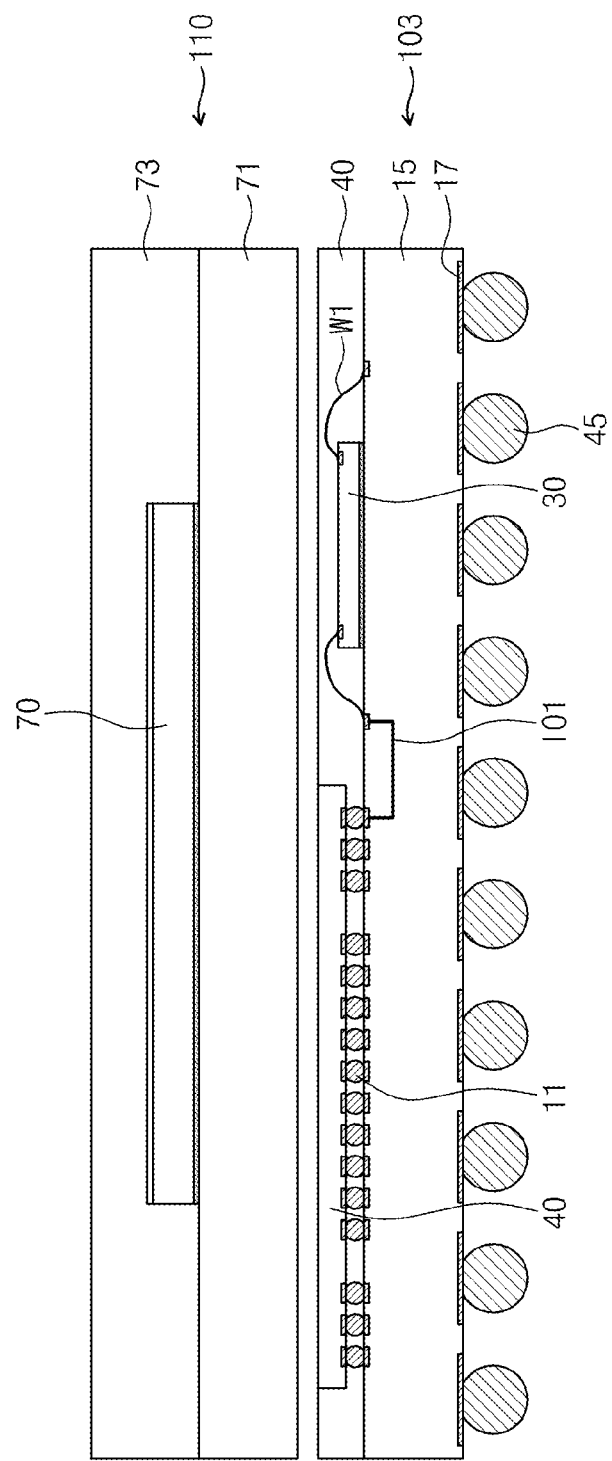
FIG. 9E is a sectional view taken along a line I-I' of a package-on-package device including the semiconductor packages of FIGS. 8 and 2 stacked one over the other.
Figure 10:
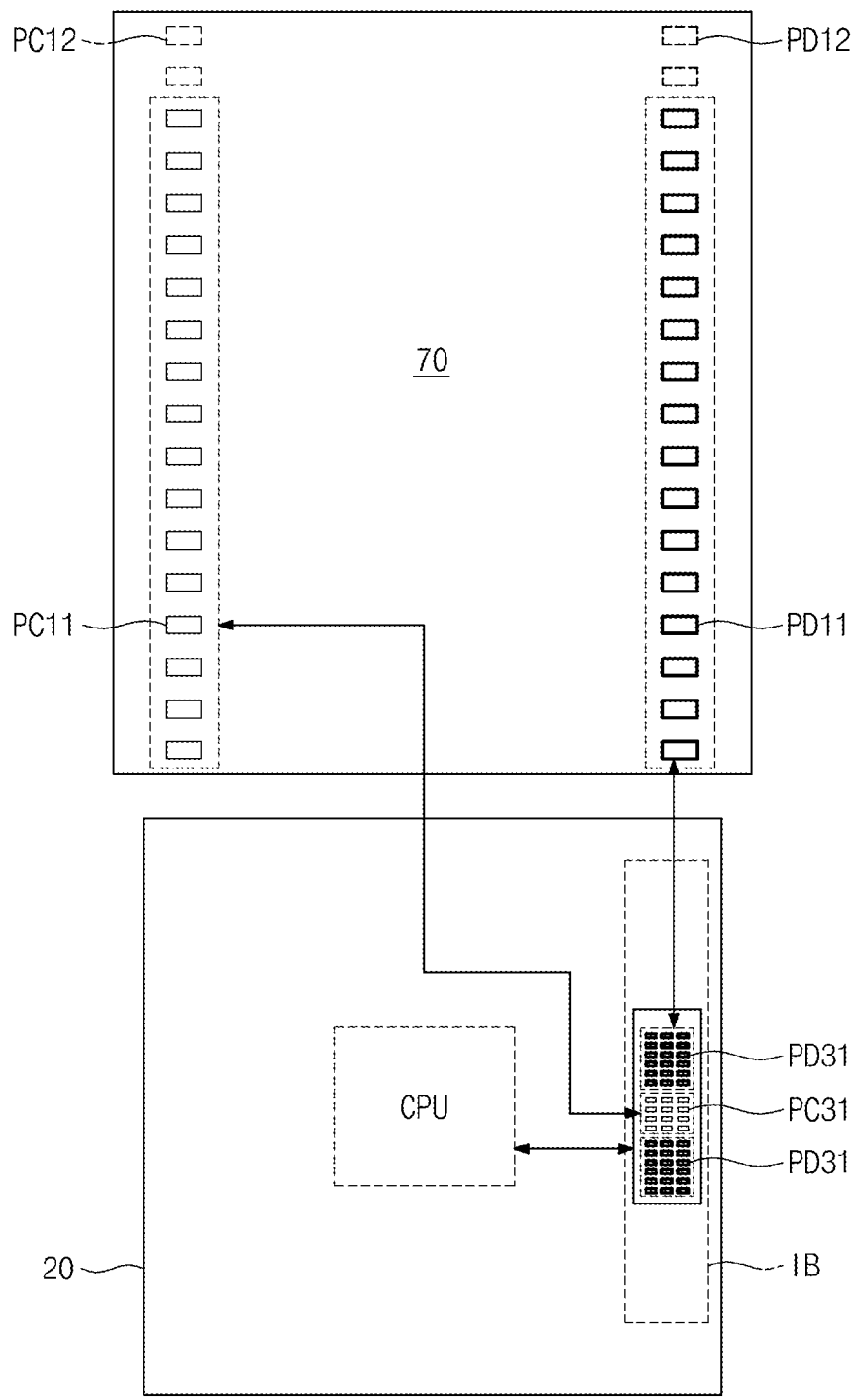
FIG. 10 is a plan view schematically illustrating a connection relation between the first and second semiconductor packages shown in FIGS. 8 and 2, respectively.

Referring to FIGS. 8, 9A through 9E, and 10, a first semiconductor package 103 may include the first logic chip 20, in which an interface region IB formed with the data bumps BD11 and the command/access bumps BC11 may be locally provided adjacent to only the third side surface S3. Accordingly, the eleventh data internal wiring ID11, the eleventh data ball land LD11, the twenty-first data ball BD21, and the twenty-first data ball land LD21, which are directly connected to the data bumps BD11, may be provided adjacent to the third side surface S3. In addition, the eleventh command/access internal wiring IC11, the eleventh command/access ball land LC11, the twenty-first command/access ball BC21, and the twenty-first command/access ball land LC21, which are directly connected to the command/access bumps BC11, may be provided adjacent to the third side surface S3. However, the first bonding pads PC11, PC12, PD11, and PD12, the conductive pads PC21, PC22, PD21, and PD22, the twenty-second command/access ball land LC22, and the twenty-second data ball land LD22 may be located at the same positions as those previously described with reference to FIGS. 1, 2, and 3A through 3D. Accordingly, as shown in FIG. 9B, the twenty-first command/access internal wiring IC21 connecting the twenty-first command/access pad PC21 to the twenty-first command/access ball land LC21 may have an increased length, compared with that of FIG. 3A.

Arrangement or positions of the data bumps BD11 and the command/access bumps BC11 disposed adjacent to the third side surface S3 may be variously modified. For example, as shown in FIG. 8, the command/access bumps BC11 may be disposed in a central region of the interface region IB or between the data bumps BD11. In other embodiments, the command/access bumps BC11 may be disposed at one or another side of the data bumps BD11. In the case where positions of the data bumps BD11 and the command/access bumps BC11 are changed, positions of the eleventh data ball land LD11 and the eleventh command/access ball land LC11 may be changed in such a way that they are positioned adjacent to the data bumps BD11 and the command/access bumps BC11.

In example embodiments, a space between the first logic chip 20 and the first package substrate 15 may be filled with the first mold layer 40, without the under-fill resin layer 25. In the case of the absence of the under-fill resin layer 25, there may be no need to form the dam 50. The first mold layer 40 may be formed to cover a side surface of the first logic chip 20 but to expose a top surface of the first logic chip 20. The first mold layer 40 may be formed to have a top surface located at a level higher than a top of the first wire W1 of the second logic chip 30. Since there is no dam in the first mold layer 40, it is possible to reduce a height of the first mold layer 40. Further, the first mold layer 40 may extend and intervene between the solder balls BC21, BC22, BD21, and BD22. Accordingly, the first mold layer 40 may prevent the solder balls BC21, BC22, BD21, and BD22 from being unintentionally electrically connected to each other. The solder balls BC21, BC22, BD21, and BD22 may be formed to have a reduced width and a reduced spacing, compared with those of FIG. 3A. For example, according to the present embodiments, a spacing between the solder balls BC21, BC22, BD21, and BD22 may be reduced to a range of about 0.4 mm. This enables the formation of more solder balls on the first package substrate 15 adjacent to the third side surface S3. Accordingly, all of the twenty-first data balls BD21 and the twenty-first command/access balls BC21 may be disposed adjacent to the third side surface S3. Some of the twenty-second command/access balls BC22, which may not need to be connected to the command/access bumps BC11 and thus be applied with a power or ground voltage for the command/access signal, may be provided on the first package substrate 15 adjacent to the first side surface S1. Accordingly, it is possible to reduce a width of the first package substrate 15.

Except for these differences, the first semiconductor package 103 may be configured to have the same technical features as that of the embodiment previously described with reference to FIGS. 1, 2, and 3A through 3D.

Figure 11:
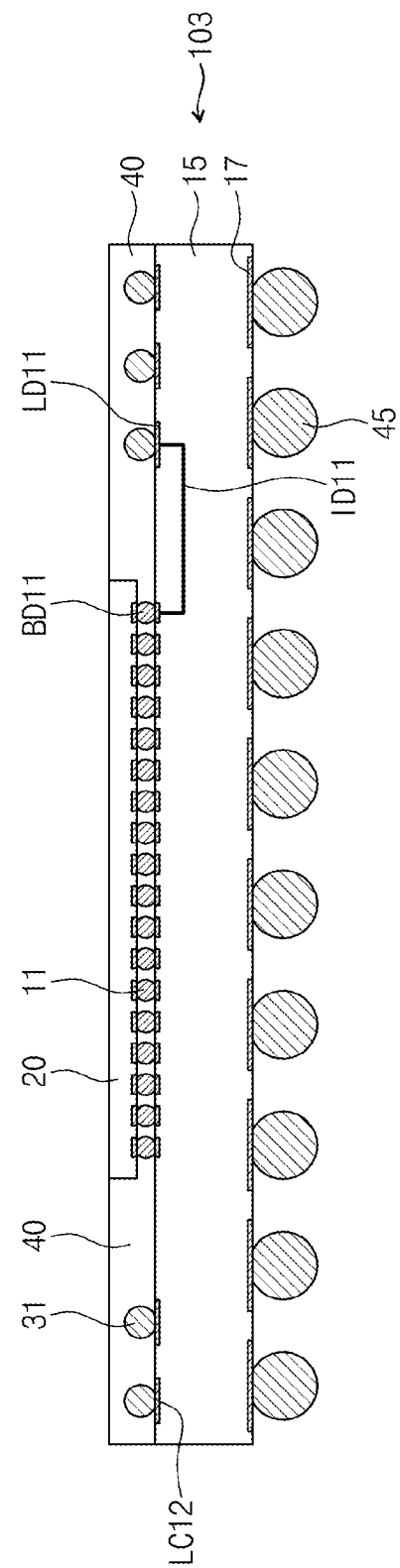
FIGS. 11 and 12 are sectional views illustrating a process of fabricating the package-on-package device of FIG. 9A.
Figure 12:
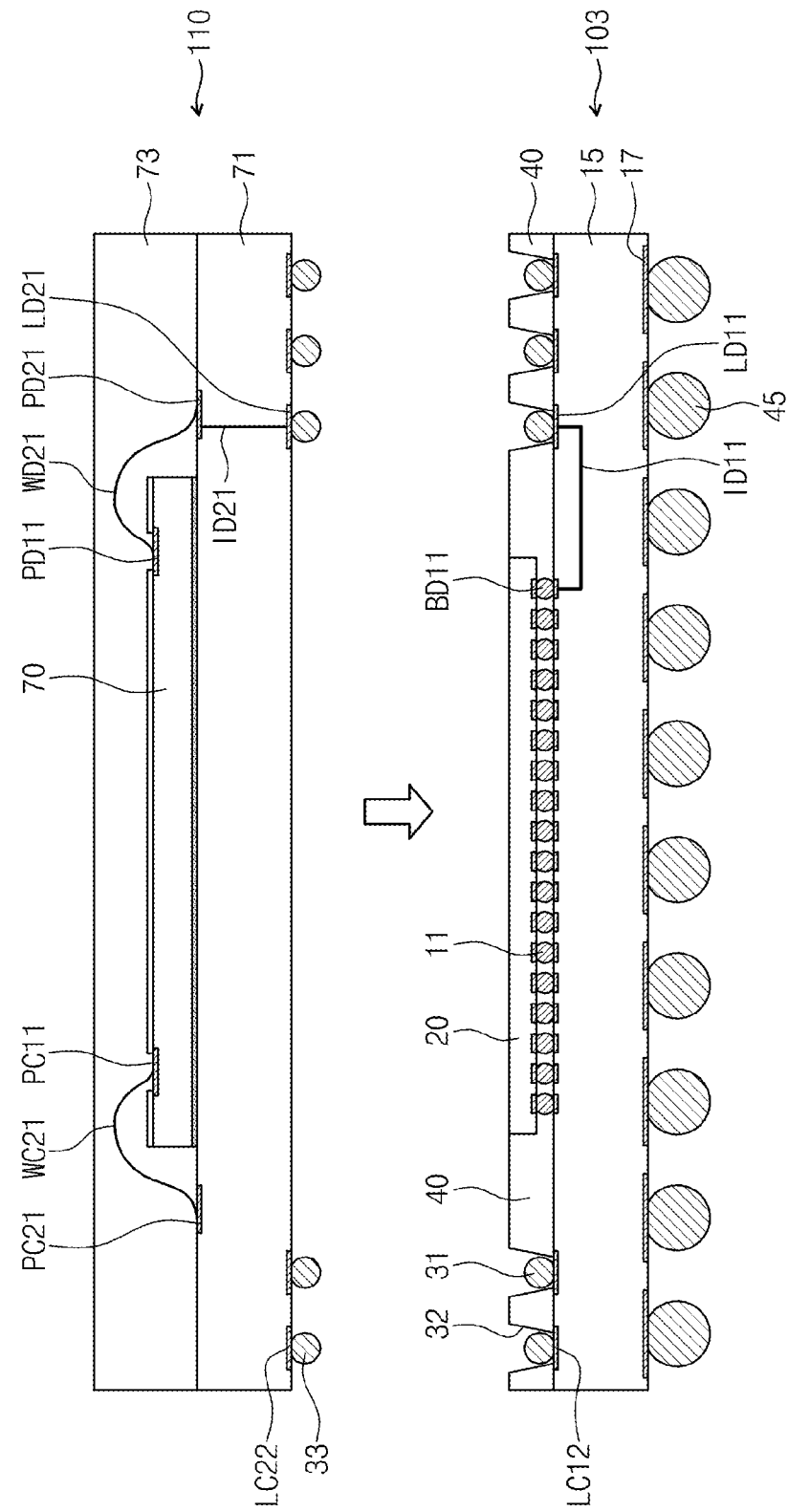

FIGS. 11 and 12 are sectional views illustrating a process of fabricating the package-on-package device of FIG. 9A.

Referring to FIGS. 8, 9A through 9E, and 11, the first logic chip 20 may be mounted on the first package substrate 15 in a flip-chip bonding manner. Next, the second logic chip 30 may be mounted on the first package substrate 15 in a wire bonding manner. First internal solder balls 31 may be attached to the upper ball lands LC11, LC12, LD11, and LD12. The first internal solder balls 31 may be formed to have widths smaller than the solder balls BC21, BC22, BD21, and BD22 of FIG. 3A. Thereafter, the first mold layer 40 may be formed on the resulting structure. The first mold layer 40 may be formed to expose the top surface of the first logic chip 20, to cover the side surface of the first logic chip 20, and to fill a space between the first logic chip 20 and the first package substrate 15. In addition, the first mold layer 40 may be formed to cover the first internal solder balls 31. During the formation of the first mold layer 40, a resin solution for forming the mold layer may be flowed into the space between the first logic chip 20 and the first package substrate 15, but not on the top surface of the first logic chip 20. Accordingly, no void may be inadvertently allowed to form or to exist between the first logic chip 20 and the first package substrate 15. Further, an additional under-fill resin layer may not need to be formed between the first logic chip 20 and the first package substrate 15, and thus, there may be no need to form the dam. The external solder balls 45 may be attached to the bottom surface of the first package substrate 15.

Referring to FIGS. 8, 9A through 9E, and 12, the first mold layer 40 may be partially removed to form holes 32 (FIG. 12) through the mold layer 40 exposing the first internal solder balls 31. In example embodiments, the formation of the holes 32 may be performed using a laser beam. As a result, the first semiconductor package 103 may be formed. The memory chip 70 may be mounted on the second package substrate 71 in a wire bonding manner, and thereafter, the second mold layer 73 may be formed on the resulting structure. The second mold layer 73 may be formed to have a top surface higher than the tops of the second wires WC21, WC22, WD21, and WD22. Second internal solder balls 33 may be attached to the bottom surface of the second package substrate 71. The second internal solder balls 33 may have substantially the same size as those of the first internal solder balls 31. As a result, the second semiconductor package 110 may be formed.

The second semiconductor package 110 may be positioned on the first semiconductor package 101 and then may be thermally treated in such a way that the internal solder balls 31 and 33 may be melted and electrically connected to each other. As a result, a package-on-package device according to other example embodiments of the inventive concept may be formed.

Figure 13:
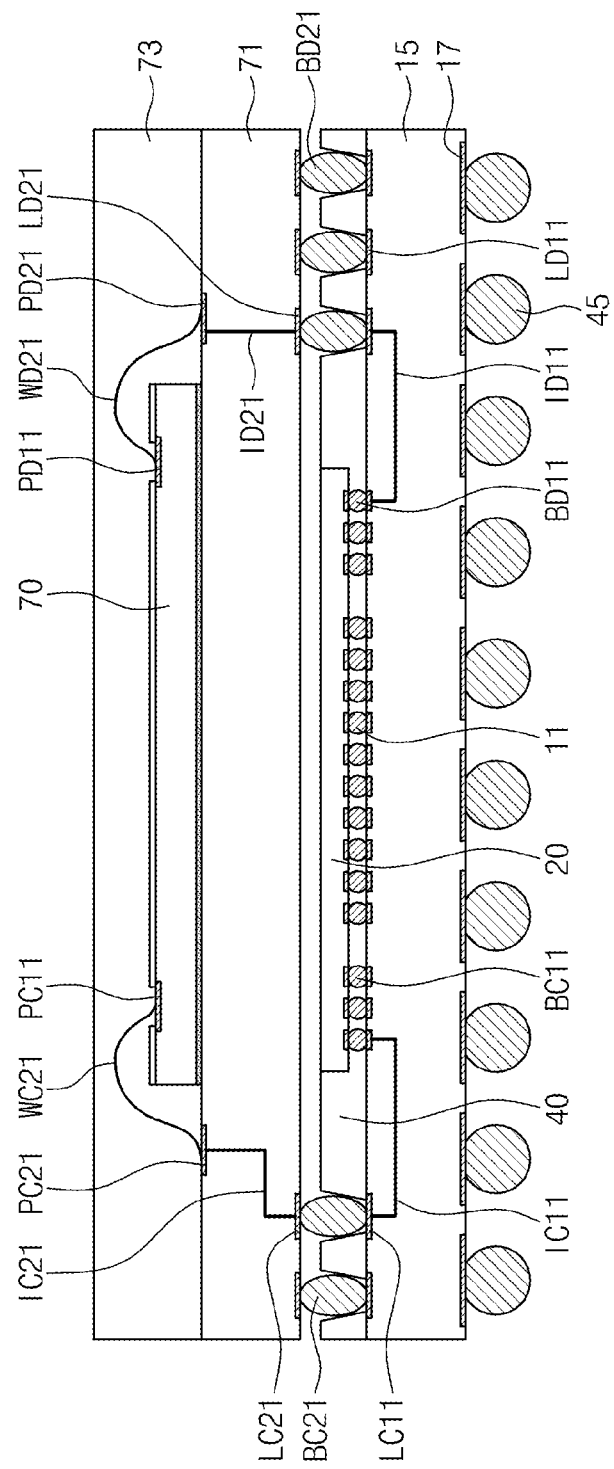
FIG. 13 is a sectional view of a package-on-package device modified from that of FIG. 9A.

FIG. 13 is a sectional view of a package-on-package device modified from that of FIG. 9A.

Referring to FIG. 13, a package-on-package device according to the present embodiment of the inventive concept may be configured not to have the under-fill resin layer and the dam, similar to that of FIG. 9A. The first mold layer 30 may be formed to expose the top surface of the first logic chip 20, to fill a space between the first logic chip 20 and the first package substrate 15, and to fill gap regions between the solder balls BC21, BC22, BD21, and BD22. Besides, a connection structure of wires or arrangement or positions of the solder balls BC21, BC22, BD21, and BD22 may be configured to be equivalent to that of FIG. 3A.

Figure 14:
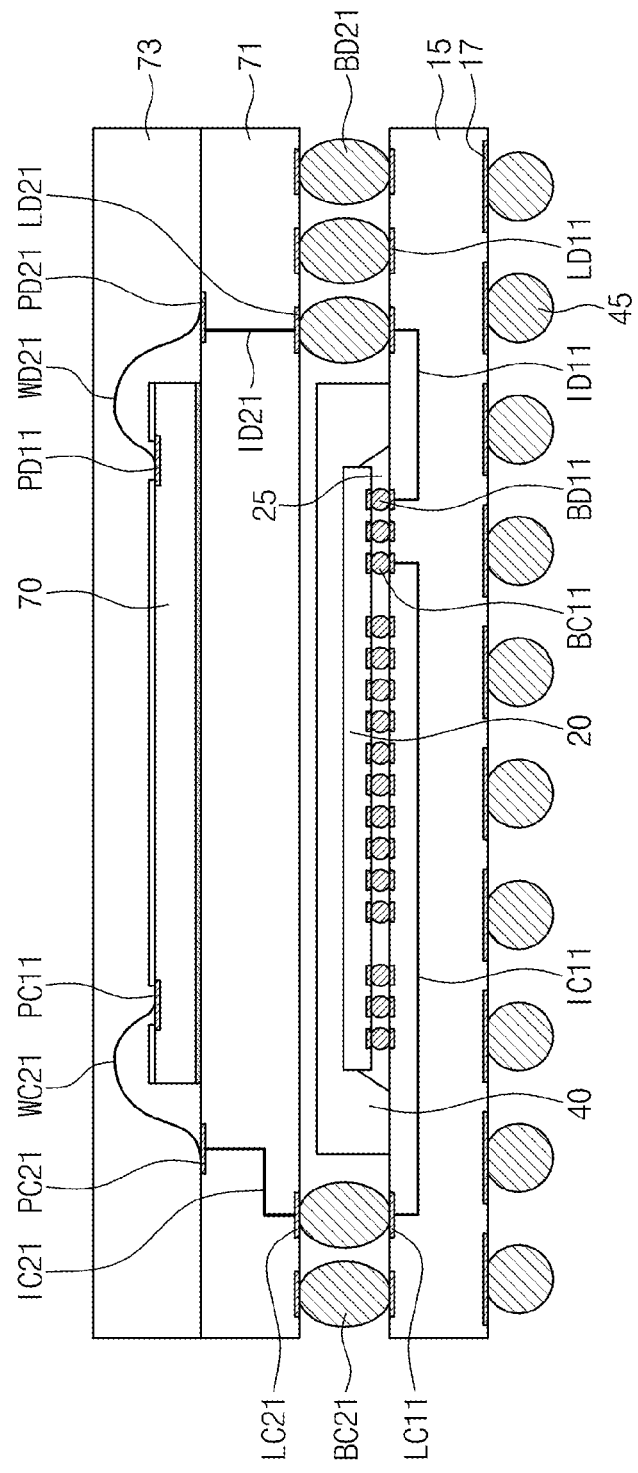
FIG. 14 is a sectional view of a package-on-package device modified from that of FIG. 3A.

FIG. 14 is a sectional view of a package-on-package device modified from that of FIG. 3A.

Referring to FIG. 14, a package-on-package device according to the present embodiment of the inventive concept may be configured to have the under-fill resin layer 25 and the dam 50, similar to that of FIG. 3A. However, the bumps BD11, BC11, and 11 may be arranged to have technical features substantially equivalent or similar to those of the embodiments described with reference to FIGS. 8 and 9A. The solder balls BC21, BC22, BD21, and BD22 may be arranged to have technical features substantially equivalent or similar to those of the embodiments described with reference to FIGS. 8 and 9A. Alternatively, the solder balls BC21, BC22, BD21, and BD22 may be arranged to have technical features substantially equivalent or similar to those of the embodiments described with reference to FIGS. 1 and 3A. Further, the eleventh command/access internal wiring IC11 may have an increased length, as shown in FIG. 14. Other technical features, except for these differences, may be substantially the same as those of the previous embodiments.

According to example embodiments of the inventive concept, the package-on-package device may include solder balls, which are disposed at only two opposing side portions of a package substrate. Thus, the solder balls may be provided not to surround all four sides of a logic chip. Accordingly, the package-on-package device can have a reduced size and superior performance.

Further, input/output pads of the logic chip and the solder balls, which need to be directly connected to each other, can be disposed adjacent to each other. This improves the routability of signals to and from the solder balls and reduces the lengths of the interconnection lines. Accordingly, it is possible to reduce signal interference, to increase signal delivery speed, and to improve a signal-quality and a power-delivery property.

While example embodiments of the inventive concepts have been particularly shown and described, it will be understood by one of ordinary skill in the art that variations in form and detail may be made therein without departing from the spirit and scope of the attached claims.

What is claimed is:
1. A package-on-package device, comprising:
a first semiconductor package including a first package substrate and a first logic chip mounted on the first package substrate;
a second semiconductor package overlying the first semiconductor package to include a second package substrate and a memory chip mounted on the second package substrate; and
a plurality of solder balls provided between the first and second package substrates to connect the first and second package substrates with each other,
wherein the first logic chip includes first, second, third, and fourth side surfaces disposed in that order around the first logic chip's perimeter, and
wherein the solder balls are provided on regions of the first package substrate adjacent to the first and third opposing side surfaces but not on regions of the first package substrate adjacent to the second and fourth opposing side surfaces, wherein the memory chip comprises a first data input/output pad and a first command access input/output pad, wherein the first logic chip comprises a second data input/output pad and a second command access input/output pad forming counterparts to the first data input/output pad and to the first command access input/output pad, respectively, wherein the solder balls comprise a first data ball electrically connecting the first and second data input/output pads with each other and a first command access ball electrically connecting the first and second command access input/output pads with each other, wherein the first data ball and the first command access ball are disposed adjacent to the second data input/output pad and to the second command access input/output pad, respectively, wherein the first and second data input/output pads and the first data ball are disposed adjacent to the third side surface, and wherein the first and second command access input/output pads and the first command access ball are disposed adjacent to the first side surface.

2. The device of claim 1, wherein the first logic chip is mounted on the first package substrate in a flip-chip bonding manner, the first semiconductor package further comprises:
an under-fill resin layer filling a space between the first logic chip and the first package substrate; and
a mold layer covering the first logic chip.

3. The device of claim 2, wherein the first semiconductor package further comprises:
a second logic chip mounted on the first package substrate and electrically connected to the first logic chip; and
a dam disposed between the under-fill resin layer and the second logic chip,
wherein the mold layer extends to cover the dam and the second logic chip.

4. The device of claim 3, wherein the dam extends between the first side surface and the solder balls and between the third side surface and the solder balls.

5. A package-on-package device, comprising:
a first semiconductor package including a first package substrate and a first logic chip mounted on the first package substrate;
a second semiconductor package overlying the first semiconductor package to include a second package substrate and a memory chip mounted on the second package substrate; and
a plurality of solder balls provided between the first and second package substrates to connect the first and second package substrates with each other,
wherein the first logic chip includes first, second, third, and fourth side surfaces disposed in that order around the first logic chip's perimeter,
wherein the solder balls are provided on regions of the first package substrate adjacent to the first and third opposing side surfaces but not on regions of the first package substrate adjacent to the second and fourth opposing side surfaces,
wherein the first logic chip is mounted on the first package substrate in a flip-chip bonding manner, and
wherein the first semiconductor package further comprises:
an under-fill resin layer filling a space between the first logic chip and the first package substrate; and
a mold layer covering the first logic chip,
wherein the memory chip comprises a first data input/output pad and a first command access input/output pad,
the first logic chip comprises a second data input/output pad and a second command access input/output pad forming counterparts to the first data input/output pad and to the first command access input/output pad, respectively,
the solder balls comprise a first data ball electrically connecting the first and second data input/output pads with each other and a first command access ball electrically connecting the first and second command access input/output pads with each other, and
the first data ball and the first command access ball are disposed adjacent to the second data input/output pad and to the second command access input/output pad, respectively,
wherein the first and second data input/output pads, the second command access input/output pad, the first data ball and the first command access ball are disposed adjacent to the third side surface, and
wherein the first command access pad is disposed adjacent to the first side surface.

6. The device of claim 5, wherein the memory chip further comprises a third data input/output pad and a third command access input/output pad, the third data input/output pad and the third command access input/output pad each configured to be supplied with a power or ground voltage,
the solder balls further comprises a second data ball electrically connected to the third data input/output pad but electrically isolated from the second data input/output pad, and a second command access ball electrically connected to the third command access input/output pad but electrically isolated from the second command access input/output pad, and
the second data ball is disposed adjacent to the first data input/output pad and the second command access ball is disposed adjacent to the first command access input/output pad.

7. The device of claim 5, wherein the first logic chip is mounted on the first package substrate in a flip-chip bonding manner, and
the first semiconductor package further comprises a mold layer covering a side surface of the first logic chip, exposing a top surface of the first logic chip, and filling a space between the first logic chip and the first package substrate.

8. The device of claim 7, wherein the mold layer extends to have a portion interposed between the solder balls.

9. The device of claim 7, wherein the first semiconductor package further comprises:
a second logic chip provided on the first package substrate and electrically connected to the first logic chip; and
a wire electrically connecting the second logic chip with the first package substrate,
wherein the mold layer extends to cover the second logic chip and the wire.

* * * * *